(12) United States Patent
Haldi et al.

(10) Patent No.: US 10,937,982 B2
(45) Date of Patent: Mar. 2, 2021

(54) ORGANIC ELECTROLUMINESCENT DEVICE EMITTING BLUE LIGHT

(71) Applicant: CYNORA GMBH, Bruchsal (DE)

(72) Inventors: Andreas Haldi, Heidelberg (DE); Georgios Liaptsis, Mannheim (DE); Harald Fluegge, Karlsruhe (DE); Patrick Pingel, Potsdam (DE); Stefan Hoefle, Karlsruhe (DE)

(73) Assignee: CYNORA GMBH, Bruchsal (DE)

( * ) Notice: Subject to any disclaimer, the term of this patent is extended or adjusted under 35 U.S.C. 154(b) by 347 days.

(21) Appl. No.: 15/971,005

(22) Filed: May 4, 2018

(65) Prior Publication Data

US 2018/0323395 A1 Nov. 8, 2018

(30) Foreign Application Priority Data

May 8, 2017 (EP) .................................... 17169901

(51) Int. Cl.
*H01L 51/00* (2006.01)
*H01L 51/50* (2006.01)
*H01L 51/52* (2006.01)

(52) U.S. Cl.
CPC ...... *H01L 51/5024* (2013.01); *H01L 51/0067* (2013.01); *H01L 51/0072* (2013.01); *H01L 51/5004* (2013.01); *H01L 51/5016* (2013.01); *H01L 51/5028* (2013.01); *H01L 51/5036* (2013.01); *H01L 51/5206* (2013.01); *H01L 51/5221* (2013.01); *H01L 51/5056* (2013.01); *H01L 51/5072* (2013.01); *H01L 2251/552* (2013.01)

(58) Field of Classification Search
CPC ........................ H01L 51/5024; H01L 51/5028
See application file for complete search history.

(56) References Cited

U.S. PATENT DOCUMENTS

| 2015/0280158 A1 | 10/2015 | Ogiwara et al. |
| 2016/0056393 A1* | 2/2016 | Oikawa ............... H01L 51/0064 257/40 |
| 2016/0329512 A1 | 11/2016 | Nishide et al. |
| 2018/0026202 A1 | 1/2018 | Danz et al. |

FOREIGN PATENT DOCUMENTS

WO 2017/005699 A1 1/2017

OTHER PUBLICATIONS

Nakanotani et al., Nature Communications, 5:4016, 2014, pp. 1-7.*

* cited by examiner

*Primary Examiner* — Vu A Nguyen
(74) *Attorney, Agent, or Firm* — J.A. Lindeman & Co. PLLC

(57) ABSTRACT

The present invention relates to a an organic electroluminescent device comprising a light-emitting layer B comprising a host material $H^B$, a first thermally activated delayed fluorescence (TADF) material $E^B$, and a second TADF material $S^B$, wherein $E^B$ transfers energy to $S^B$ and $S^B$ emits TADF with an emission maximum between 420 and 500 nm.

16 Claims, 1 Drawing Sheet

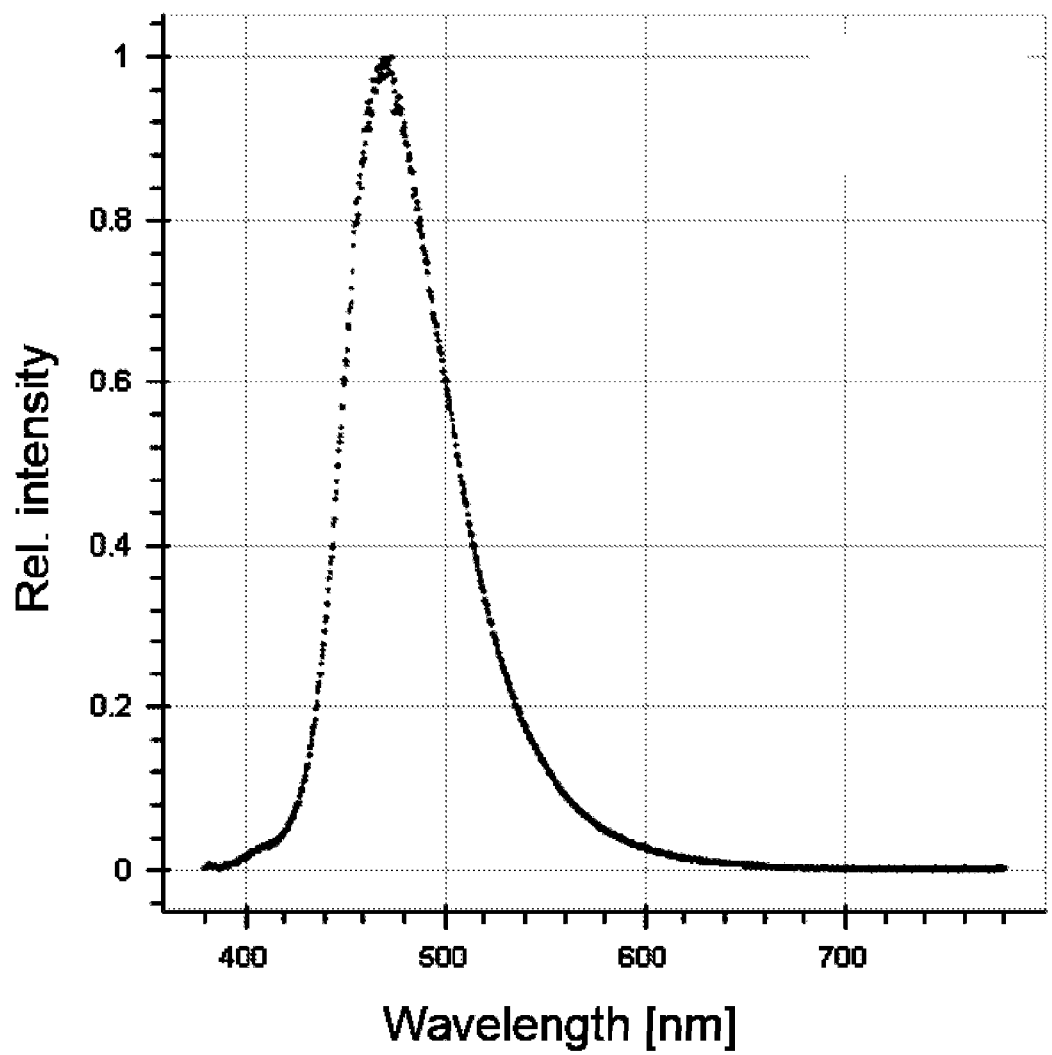

ORGANIC ELECTROLUMINESCENT DEVICE EMITTING BLUE LIGHT

The present invention relates to organic electroluminescent devices comprising a light-emitting layer B comprising a host material $H^B$, a first thermally activated delayed fluorescence (TADF) material $E^B$, and a second TADF material $S^B$, wherein $E^B$ transfers energy to $S^B$, and $S^B$ emits TADF with an emission maximum between 420 and 500 nm.

DESCRIPTION

Organic electroluminescent devices containing one or more light-emitting layers based on organics such as, e.g., organic light emitting diodes (OLEDs), light emitting electrochemical cells (LECs) and light-emitting transistors gain increasing importance. In particular, OLEDs are promising devices for electronic products such as e.g. screens, displays and illumination devices. In contrast to most electroluminescent devices essentially based on inorganics, organic electroluminescent devices based on organics are often rather flexible and producible in particularly thin layers. The OLED-based screens and displays already available today bear particularly beneficial brilliant colors, contrasts and are comparably efficient with respect to their energy consumption.

A central element of an organic electroluminescent device for generating light is a light-emitting layer placed between an anode and a cathode. When a voltage (and current) is applied to an organic electroluminescent device, holes and electrons are injected from an anode and a cathode, respectively, to the light-emitting layer. Typically, a hole transport layer is located between light-emitting layer and the anode, and an electron transport layer is located between light-emitting layer and the cathode. The different layers are sequentially disposed. Excitons of high energy are then generated by recombination of the holes and the electrons. The decay of such excited states (e.g., singlet states such as S1 and/or triplet states such as T1) to the ground state (S0) desirably leads to light emission.

In order to enable efficient energy transport and emission, an organic electroluminescent device comprises one or more host compounds and one or more emitter compounds as dopants. Challenges when generating organic electroluminescent devices are thus the improvement of the illumination level of the devices (i.e., brightness per current), obtaining a desired light spectrum and achieving suitable (long) lifespans.

There is still a lack of efficient and stable OLEDs that emit in the deep blue region of the visible light spectrum, which would be expressed by a small $CIE_y$ value. Accordingly, there is still the unmet technical need for organic electroluminescent devices which have a long lifetime and high quantum yields, in particular in the deep blue range.

Surprisingly, it has been found that an organic electroluminescent device's light-emitting layer comprising two thermally activated delayed fluorescence (TADF) materials and a host material provides an organic electroluminescent device having good lifetime and quantum yields and exhibiting deep blue emission. Herein, one of the TADF materials, in particular the one having a higher singlet state energy level, transfers energy to the other TADF material, in particular having a lower singlet state energy level, which bears an emission maximum between 420 and 500 nm. Surprisingly, devices either show an emission at a lower wavelength, longer lifetime and/or higher efficiencies than devices comprising only one of the two TADF materials in the light-emitting layer.

Accordingly, one aspect of the present invention relates to an organic electroluminescent device which comprises a light-emitting layer B comprising:
(i) a host material $H^B$, which has a lowermost excited singlet state energy level $S1^H$ and a lowermost excited triplet state energy level $T1^H$,
(ii) a first thermally activated delayed fluorescence (TADF) material $E^B$, which has a lowermost excited singlet state energy level $S1^E$ and a lowermost excited triplet state energy level $T1^E$; and
(iii) a second TADF material 5B, which has a lowermost excited singlet state energy level $S1^S$ and a lowermost excited triplet state energy level $T1^S$, wherein $E^B$ transfers energy to $S^B$ and $S^B$ emits thermally activated delayed fluorescence with an emission maximum between 420 and 500 nm; and wherein the relations expressed by the following formulas (1) to (4) apply:

$$S1^H > S1^E \quad (1)$$

$$S1^H > S1^S \quad (2)$$

$$S1^E > S1^S \quad (3)$$

$$T1^H > T1^S \quad (4).$$

According to the invention, the lowermost excited singlet state of the host material $H^B$ is higher in energy than the lowermost excited singlet state of the first thermally activated delayed fluorescence (TADF) material $E^B$. The lowermost excited singlet state of the host material $H^B$ is higher in energy than the lowermost excited singlet state of the second TADF material $S^B$. The lowermost excited singlet state of the first TADF material $E^B$ is higher in energy than the lowermost excited singlet state of the second TADF material $S^B$. The lowermost excited triplet state of the host material $H^B$ is higher in energy than the lowermost excited triplet state of the second TADF material $S^B$.

As used herein, the terms "TADF material" and "TADF emitter" may be understood interchangeably. When one of the terms "emitter" "emitter compound" or the like is used, this may be understood in that preferably a TADF material of the present invention is meant, in particular one of those designated as $E^B$ and $S^B$, respectively.

In a preferred embodiment, the lowermost excited triplet state of the host material $H^B$ is higher in energy than the lowermost excited triplet state of the first TADF material $E^B$: $T1^H > T1^E$.

Alternatively, the lowermost excited triplet state of the host material $H^B$ may be lower in energy than the lowermost excited triplet state of the first TADF material $E^B$: $T1^H < T1^E$.

In a preferred embodiment, the lowermost excited triplet state of the first TADF material $E^B$ is higher in energy than the lowermost excited triplet state of the second TADF material $S^B$: $T1^E > T1^S$.

In a preferred embodiment, the following relation apply $S1^E > S1^S \geq T1^E > T1^S$ and $S1^E - T1^S \leq 0.4$ eV. In other words, the lowermost excited singlet state of the first TADF material $E^B$ is higher in energy than lowermost excited singlet state of the second TADF material $S^B$, which is at least equal to or higher in energy than or equal in energy with the lowermost excited triplet state of the first TADF material $E^B$, which is higher in energy than the lowermost excited triplet state of second TADF material $S^B$. In a preferred embodiment, all four states are within a range (i.e., difference in energy) of 0.4 eV or less, preferably in a range of 0.3 eV or less, particular in a range of 0.2 eV or less.

Due to the low energy difference between the lowermost excited singlet and triplet states of the TADF materials $E^B$ and $S^B$ exciton transfer between different states of $E^B$ and $S^B$ is sufficiently enabled. In addition, transfers between states of different multiplicities may be enabled due to the low energy difference.

This may include energy transfer
 (a) from a singlet state of one TADF material to the singlet state of the other TADF material,
 (b) from a triplet state of one TADF material to the triplet state of the other TADF material,
 (c) from a singlet state of one TADF material to the triplet state of the other TADF material, and/or
 (d) from a triplet state of one TADF material to the singlet state of the other TADF material.

Interestingly, in a variety of combinations of $E^B$ and $S^B$ of the present invention, energy transfer may also occur to higher as well as lower energy levels, such as exemplarily:
 (a) from $T1^S$ to $S1^E$,
 (b) from $S1^S$ to $T1^E$,
 (c) from $T1^E$ to $S1^S$,
 (d) from $S1^E$ to $T1^S$,
 (e) from $S1^S$ to $S1^E$,
 (f) from $S1^E$ to $S1^S$,
 (g) from $T1^S$ to $T1^E$, and/or
 (h) from $T1^E$ to $T1^S$.

Surprisingly it was found, that the main contribution to the emission band of the optoelectronic device according to the invention can be attributed to the emission of $S^B$ indicating a sufficient transfer of energy from $E^B$ to $S^B$.

The emission of the device according to the invention typically appears blue-shifted compared to devices with similar device architecture and an emission layer comprising the TADF material $S^B$ as emitter and/or show longer lifetimes and/or higher efficiencies.

The emission of the device according to the invention show longer lifetimes and/or higher efficiencies compared to devices with similar device architecture and an emission layer comprising the TADF material $E^B$, while the emission appears at similar colors or even blue-shifted.

Particularly interesting is that, depending on the combinations of $E^B$ and $S^B$ of the present invention, energy from lower energy states can also be transferred to higher energy states of the other compound. Also taking the reversed intersystem crossing (RISC) occurring in TADF emitters into account, the combinations of $E^B$ and $S^B$ of the present invention may lead to particularly high emission of the TADF material $S^B$.

According to the present invention, a TADF material is characterized in that it exhibits a $\Delta E_{ST}$ value, which corresponds to the energy difference between the lowermost excited singlet state (S1) and the lowermost excited triplet state (T1), of less than 0.4 eV, preferably less than 0.3 eV, more preferably less than 0.2 eV, even more preferably less than 0.1 eV or even less than 0.05 eV.

As used herein, the terms organic electroluminescent device and opto-electronic light-emitting devices may be understood in the broadest sense as any device comprising a light-emitting layer B comprising a host material $H^B$, a first TADF material $E^B$ and a second TADF material $S^B$.

The organic electroluminescent device may be understood in the broadest sense as any device based on organic materials that is suitable for emitting light in the visible or nearest ultraviolet (UV) range, i.e., in the range of a wavelength of from 380 to 800 nm. More preferably, organic electroluminescent device may be able to emit light in the visible range, i.e., of from 400 to 800 nm.

In a preferred embodiment, the organic electroluminescent device is a device selected from the group consisting of an organic light emitting diode (OLED), a light emitting electrochemical cell (LEC), and a light-emitting transistor.

Particularly preferably, the organic electroluminescent device is an organic light emitting diode (OLED). Optionally, the organic electroluminescent device as a whole may be intransparent, semi-transparent or (essentially) transparent.

The term "layer" as used in the context of the present invention preferably is a body that bears an extensively planar geometry.

The light-emitting layer B preferably bears a thickness of not more than 1 mm, more preferably not more than 0.1 mm, even more preferably not more than 10 µm, even more preferably not more than 1 µm, in particular not more than 0.1 µm.

In a preferred embodiment, the first thermally activated delayed fluorescence (TADF) material $E^B$ is an organic TADF emitter. According to the invention, organic emitter or organic material means that the emitter or material (predominantly) consists of the elements hydrogen, carbon, nitrogen, and optionally fluorine and optionally oxygen. Particularly preferably, it does not contain any transition metals.

In a preferred embodiment, the first TADF material $E^B$ is an organic TADF emitter. In a preferred embodiment, the second TADF material $S^B$ is an organic TADF emitter. In a more preferred embodiment, the first TADF material $E^B$ and the second TADF material $S^B$ are both organic TADF emitters.

In a particularly preferred embodiment, the at least one TADF material $E^B$ is a blue TADF emitter, preferably a deep-blue TADF emitter.

The person skilled in the art will notice that the light-emitting layer B will typically be incorporated in the organic electroluminescent device of the present invention. Preferably, such organic electroluminescent device comprises at least the following layers: at least one light-emitting layer B, at least one anode layer A and at least one cathode layer C.

Preferably, the anode layer A contains at least one component selected from the group consisting of indium tin oxide, indium zinc oxide, PbO, SnO, graphite, doped silicium, doped germanium, doped GaAs, doped polyaniline, doped polypyrrole, doped polythiophene, and mixtures of two or more thereof.

Preferably, the cathode layer C contains at least one component selected from the group consisting of Al, Au, Ag, Pt, Cu, Zn, Ni, Fe, Pb, In, W, Pd, LiF, Ca, Ba, Mg, and mixtures or alloys of two or more thereof.

Preferably, the light-emitting layer B is located between an anode layer A and a cathode layer C. Accordingly, the general set-up is preferably A-B-C. This does of course not exclude the presence of one or more optional further layers. These can be present at each side of A, of B and/or of C.

In a preferred embodiment, the organic electroluminescent device comprises at least the following layers:

A) an anode layer A containing at least one component selected from the group consisting of indium tin oxide, indium zinc oxide, PbO, SnO, graphite, doped silicium, doped germanium, doped GaAs, doped polyaniline, doped polypyrrole, doped polythiophene, and mixtures of two or more thereof;

B) the light-emitting layer B; and
C) a cathode layer C containing at least one component selected from the group consisting of Al, Au, Ag, Pt, Cu, Zn, Ni, Fe, Pb, In, W, Pd, LiF, Ca, Ba, Mg, and mixtures or alloys of two or more thereof,
wherein the light-emitting layer B is located between the anode layer A and the a cathode layer C.

In one embodiment, when the organic electroluminescent device is an OLED, it may optionally comprise the following layer structure:
A) an anode layer A, exemplarily comprising indium tin oxide (ITO); HTL) a hole transport layer HTL;
B) a light-emitting layer B according to present invention as described herein; ETL) an electron transport layer ETL; and
C) a cathode layer, exemplarily comprising Al, Ca and/or Mg.

Preferably, the order of the layers herein is A-HTL-B-ETL-C.

Furthermore, the organic electroluminescent device may optionally comprise one or more protective layers protecting the device from damaging exposure to harmful species in the environment including, exemplarily moisture, vapor and/or gases.

Preferably, the anode layer A is located on the surface of a substrate. The substrate may be formed by any material or composition of materials. Most frequently, glass slides are used as substrates. Alternatively, thin metal layers (e.g., copper, gold, silver or aluminum films) or plastic films or slides may be used. This may allow a higher degree of flexibility. The anode layer A is mostly composed of materials allowing to obtain an (essentially) transparent film. As at least one of both electrodes should be (essentially) transparent in order to allow light emission from the OLED, either the anode layer A or the cathode layer C transparent. Preferably, the anode layer A comprises a large content or even consists of transparent conductive oxides (TCOs).

Such anode layer A may exemplarily comprise indium tin oxide, aluminum zinc oxide, fluor tin oxide, indium zinc oxide, PbO, SnO, zirconium oxide, molybdenum oxide, vanadium oxide, wolfram oxide, graphite, doped Si, doped Ge, doped GaAs, doped polyaniline, doped polypyrrol and/or doped polythiophene.

Particularly preferably, the anode layer A (essentially) consists of indium tin oxide (ITO) (e.g., $(InO_3)_{0.9}(SnO_2)_{0.1}$). The roughness of the anode layer A caused by the transparent conductive oxides (TCOs) may be compensated by using a hole injection layer (HIL). Further, the HIL may facilitate the injection of quasi charge carriers (i.e., holes) in that the transport of the quasi charge carriers from the TCO to the hole transport layer (HTL) is facilitated. The hole injection layer (HIL) may comprise poly-3,4-ethylendioxy thiophene (PEDOT), polystyrene sulfonate (PSS), $MoO_2$, $V_2O_5$, CuPC or CuI, in particular a mixture of PEDOT and PSS. The hole injection layer (HIL) may also prevent the diffusion of metals from the anode layer A into the hole transport layer (HTL). The HIL may exemplarily comprise PEDOT:PSS (poly-3,4-ethylendioxy thiophene: polystyrene sulfonate), PEDOT (poly-3,4-ethylendioxy thiophene), mMTDATA (4,4',4''-tris[phenyl(m-tolyl)amino]triphenylamine), Spiro-TAD (2,2',7,7'-tetrakis(n,n-diphenylamino)-9,9'-spirobifluorene), DNTPD (N1,N1'-(biphenyl-4,4'-diyl)bis(N1-phenyl-N4,N4-di-m-tolylbenzene-1,4-diamine), NPB (N,N'-nis-(1-naphthalenyl)-N,N'-bis-phenyl-(1,1'-biphenyl)-4,4'-diamine), NPNPB (N,N'-diphenyl-N,N'-di-[4-(N,N-diphenyl-amino)phenyl]benzidine), MeO-TPD (N,N,N',N'-tetrakis(4-methoxyphenyl)-benzidine), HAT-CN (1,4,5,8,9,11-hexaazatriphenylen-hexacarbonitrile) and/or Spiro-NPD (N,N'-diphenyl-N,N'-bis-(1-naphthyl)-9,9'-spirobifluorene-2,7-diamine).

Adjacent to the anode layer A or hole injection layer (HIL) typically a hole transport layer (HTL) is located. Herein, any hole transport compound may be used. Exemplarily, electron-rich heteroaromatic compounds such as triarylamines and/or carbazoles may be used as hole transport compound. The HTL may decrease the energy barrier between the anode layer A and the light-emitting layer B (serving as emitting layer (EML)). The hole transport layer (HTL) may also be an electron blocking layer (EBL). Preferably, hole transport compounds bear comparably high energy levels of their triplet states T1. Exemplarily the hole transport layer (HTL) may comprise a star-shaped heterocycle such as tris(4-carbazoyl-9-ylphenyl)amine (TCTA), poly-TPD (poly(4-butylphenyl-diphenyl-amine)), [alpha]-NPD (poly(4-butylphenyl-diphenyl-amine)), TAPC (4,4'-cyclohexyliden-bis[N,N-bis(4-methylphenyl)benzenamine]), 2-TNATA (4,4',4''-tris[2-naphthyl(phenyl)-amino]triphenylamine), Spiro-TAD, DNTPD, NPB, NPNPB, MeO-TPD, HAT-CN and/or TrisPcz (9,9'-diphenyl-6-(9-phenyl-9H-carbazol-3-yl)-9H,9'H-3,3'-bicarbazole). In addition, the HTL may comprise a p-doped layer, which may be composed of an inorganic or organic dopant in an organic hole-transporting matrix. Transition metal oxides such as vanadium oxide, molybdenum oxide or tungsten oxide may exemplarily be used as inorganic dopant.

Tetrafluorotetracyanoquinodimethane (F4-TCNQ), copper-pentafluorobenzoate (Cu(I)pFBz) or transition metal complexes may exemplarily be used as organic dopant.

The EBL may exemplarily comprise mCP (1,3-bis(carbazol-9-yl)benzene), TCTA, 2-TNATA, mCBP (3,3-di(9H-carbazol-9-yl)biphenyl), 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole, 9-[3,5-bis(2-dibenzothiophenyl)phenyl]-9H-carbazole, tris-Pcz, CzSi (9-(4-tert-butylphenyl)-3,6-bis(triphenylsilyl)-9H-carbazole), and/or DCB (N,N'-dicarbazolyl-1,4-dimethylbenzene).

According to the invention, the emission layer B comprises at least one host material $H^B$, the first TADF material $E^B$ and the second TADF material $S^B$.

In a preferred embodiment of the invention, the light-emitting layer B comprises:
(i) 5-98%, more preferably 50-92%, even more preferably 70-85% by weight of the host compound $H^B$;
(ii) 1-50%, more preferably 5-35%, even more preferably 10-20% by weight of the first TADF material $E^B$; and
(iii) 1-50%, more preferably 3-15%, even more preferably 5-10% by weight of the second TADF material $S^B$, and optionally
(iv) 0-93% by weight of one or more further host compounds $H^{B2}$ differing from $H^B$; and optionally
(v) 0-93% by weight of one or more solvents.

Exemplarily, the host material $H^B$ and/or the optionally present further host compound $H^{B2}$ may be selected from the group consisting of CBP (4,4'-Bis-(N-carbazolyl)-biphenyl), mCP, mCBP Sif87 (dibenzo[b,d]thiophen-2-yltriphenylsilane), CzSi, Sif88 (dibenzo[b,d]thiophen-2-yl)diphenylsilane), DPEPO (bis[2-(diphenylphosphino)phenyl] ether oxide), 9-[3-(dibenzofuran-2-yl)phenyl]-9H-carbazole, 9-[3-(dibenzofuran-2-yl)phenyl]-9H-carbazole, 9-[3-(dibenzothio-phen-2-yl)phenyl]-9H-carbazole, 9-[3,5-bis(2-dibenzofuranyl)phenyl]-9H-carbazole, 9-[3,5-bis(2-dibenzothiophenyl)phenyl]-9H-carbazole, T2T (2,4,6-tris(biphenyl-3-yl)-1,3,5-triazine), T3T (2,4,6-tris(triphenyl-3-yl)-1,3,5- triazine) and/or TST (2,4,6-tris(9,9'-spirobifluorene-2-yl)-1,3,5-triazine). In one embodiment of the invention, the emission layer B comprises a so-called mixed-host system with at least one hole-dominant (n-type) host and one electron-dominant (p-type) host.

In one embodiment, the emission layer B comprises the first TADF material $E^B$ and the second TADF material $S^B$, and hole-dominant host $H^B$ selected from the group consisting of CBP, mCP, mCBP, 9-[3-(dibenzofuran-2-yl)phenyl]-9H-carbazole, 9-[3-(d ibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole.

In a preferred embodiment, the first TADF material $E^B$ has a highest occupied molecular orbital HOMO($E^B$) having an energy $E^{HOMO}(E^B)$ and the host compound $H^B$ has a highest occupied molecular orbital HOMO($H^B$) having an energy $E^{Homo}(H^B)$ wherein $E^{HOMO}(E^B)-E^{HOMO}(H^B) \leq 0.3$ eV and $E^{HOMO}(E^B)-E^{HOMO}(E^B) \geq 0.3$ eV. In other words, the HOMO($H^B$) of the host $H^B$ can be higher or lower in energy compared to the HOMO($E^B$) of the first TADF material $E^B$, but the difference does not exceed 0.3 eV, more preferably does not exceed 0.2 eV.

In a preferred embodiment, the second TADF material $S^B$ has a highest occupied molecular orbital HOMO($S^B$) having an energy $E^{HOMO}(S^B)$ and the host compound $H^B$ has a highest occupied molecular orbital HOMO($H^B$) having an energy $E^{HOMO}(H^B)$, wherein $E^{HOMO}(S^B)-E^{HOMO}(H^B) \leq 0.3$ eV and $E^{HOMO}(S^B)-E^{HOMO}(H^B) \geq -0.3$ eV. In other word, the HOMO($H^B$) of the host $H^B$ can be higher or lower in energy compared to the HOMO($S^B$) of the second TADF material $S^B$, but the difference does not exceed 0.4 eV, preferably 0.3 eV, more preferably does not exceed 0.2 eV.

In a further preferred embodiment, the first TADF material $E^B$ has a highest occupied molecular orbital HOMO($E^B$) having an energy $E^{HOMO}(E^B)$, the second TADF material $S^B$ has a highest occupied molecular orbital HOMO($S^B$) having an energy $EH^{OMO}(S^B)$) and the host compound $H^B$ has a highest occupied molecular orbital HOMO($H^B$) having an energy $E^{HOMO}(H^B)$, wherein $E^{HOMO}(H^B) \geq E^{HOMO}(S^B) \geq E^{HOMO}(E^B)$.

In a further embodiment, the first TADF material $E^B$ has a highest occupied molecular orbital HOMO($E^B$) having an energy $E^{HOMO}(E^B)$, the second TADF material $S^B$ has a highest occupied molecular orbital HOMO($S^B$) having an energy $E^{HOMO}(S^B)$ and the host compound $H^B$ has a highest occupied molecular orbital HOMO($H^B$) having an energy $E^{HOMO}(H^B)$, wherein $E^{HOMO}(H^B) > E^{HOMO}(S^B) > E^{HOMO}(E^B)$. In this embodiment, the host significantly participates in the hole-transport.

In a further embodiment, the first TADF material $E^B$ has a highest occupied molecular orbital HOMO($E^B$) having an energy $E^{HOMO}(E^B)$, the second TADF material $S^B$ has a highest occupied molecular orbital HOMO($S^B$) having an energy $E^{HOMO}(S^B)$ and the host compound $H^B$ has a highest occupied molecular orbital HOMO($H^B$) having an energy $E^{HOMO}(H^B)$, wherein $E^{HOMO}(H^B) \geq E^{HOMO}(E^B) \geq E^{HOMO}(S^B)$.

In a further embodiment, the first TADF material $E^B$ has a highest occupied molecular orbital HOMO($E^B$) having an energy $E^{HOMO}(E^B)$, the second TADF material $S^B$ has a highest occupied molecular orbital HOMO($S^B$) having an energy $E^{HOMO}(S^B)$ and the host compound $H^B$ has a highest occupied molecular orbital HOMO($H^B$) having an energy $E^{HOMO}(H^B)$, wherein $E^{HOMO}(H^B) > E^{HOMO}(E^B) > E^{HOMO}(S^B)$. In this embodiment, the host significantly participates in the hole-transport.

In another embodiment, the first TADF material $E^B$ has a lowest unoccupied molecular orbital LUMO($E^B$) having an energy $E^{LUMO}E^B$) and the host compound $H^B$ has a lowest unoccupied molecular orbital LUMO($H^B$) having an energy $E^{LUMO}(H^B)$, wherein $E^{LUMO}(E^B)-E^{LUMO}(H^B) \leq 0.3$ eV and $E^{LUMO}(E^B)-E^{LUMO}(H^B) \geq -0.3$ eV. In other word, the LUMO($H^B$) of the host $H^B$ can be higher or lower in energy compared to the LUMO($E^B$) of the first TADF material $E^B$, but the difference does not exceed 0.3 eV, more preferably does not exceed 0.2 eV.

In a further embodiment, the second TADF material $S^B$ has a lowest unoccupied molecular orbital LUMO($S^B$) having an energy $E^{LUMO}(S^B)$ and the host compound $H^B$ has a lowest unoccupied molecular orbital LUMO($H^B$) having an energy $E^{LUMO}(H^B)$, wherein $E^{LUMO}(S^B)-E^{LUMO}(H^B) \leq 0.3$ eV and $E^{LUMO}(S^B)-E^{LUMO}(H^B) \geq -0.3$ eV. In other word, the LUMO($H^B$) of the host $H^B$ can be higher or lower in energy compared to the LUMO($S^B$) of the second TADF material $S^B$, but the difference does not exceed 0.3 eV, more preferably does not exceed 0.2 eV.

In a further embodiment, the first TADF material $E^B$ has a lowest unoccupied molecular orbital LUMO($E^B$) having an energy $E^{LUMO}(E^B)$, the second TADF material $S^B$ has a lowest unoccupied molecular orbital LUMO($S^B$) having an energy $E^{LUMO}(S^B)$ and the host compound $H^B$ has a lowest unoccupied molecular orbital LUMO($H^B$) having an energy $E^{LUMO}(H^B)$, wherein $E^{LUMO}(H^B)$ $E^{LUMO}(S^B)$ $E^{LUMO}(E^B)$.

In a further embodiment, the first TADF material $E^B$ has a lowest unoccupied molecular orbital LUMO($E^B$) having an energy $E^{LUMO}(E^B)$, the second TADF material $S^B$ has a lowest unoccupied molecular orbital LUMO($S^B$) having an energy $E^{LUMO}(S^B)$ and the host compound $H^B$ has a lowest unoccupied molecular orbital LUMO($H^B$) having an energy $E^{LUMO}(H^B)$, wherein $E^{LUMO}(H^B) \leq E^{LUMO}(S^B) \leq E^{LUMO}(E^B)$.

In this embodiment, the host significantly participates in the electron-transport.

In a further embodiment, the first TADF material $E^B$ has a lowest unoccupied molecular orbital LUMO($E^B$) having an energy $E^{LUMO}(E^B)$, the second TADF material $S^B$ has a lowest unoccupied molecular orbital LUMO($S^B$) having an energy $E^{LUMO}(S^B)$ and the host compound $H^B$ has a lowest unoccupied molecular orbital LUMO($H^B$) having an energy $E^{LUMO}(H^B)$, wherein $E^{LUMO}(H^B)$ $E^{LUMO}(E^B)$ $E^{LUMO}(S^B)$.

In a further embodiment, the first TADF material $E^B$ has a lowest unoccupied molecular orbital LUMO($E^B$) having an energy $E^{LUMO}(E^B)$, the second TADF material $S^B$ has a lowest unoccupied molecular orbital LUMO($S^B$) having an energy $E^{LUMO}(S^B)$ and the host compound $H^B$ has a lowest unoccupied molecular orbital LUMO($H^B$) having an energy $E^{LUMO}(H^B)$, wherein $E^{LUMO}(H^B) < E^{LUMO}(E^B) < E^{LUMO}(S^B)$. In this embodiment, the host significantly participates in the electron-transport.

In a further embodiment, the emission layer B comprises the first TADF material $E^B$ having a highest occupied molecular orbital HOMO($E^B$) having an energy $E^{HOMO}(E^B)$) and a lowest unoccupied molecular orbital LUMO($E^B$) having an energy $E^{LUMO}(E^B)$ the second TADF material $S^B$ having a highest occupied molecular orbital HOMO($S^B$) having an energy $E^{HOMO}(S^B)$ and a lowest unoccupied molecular orbital LUMO($S^B$) having an energy $E^{LUMO}(S^B)$, the host compound $H^B$ having a highest occupied molecular orbital HOMO($H^B$) having an energy $E^{HOMO}(H^B)$ and a lowest unoccupied molecular orbital LUMO($H^B$) having an energy $E^{LUMO}(H^B)$ and a further host compound $H^{B2}$ having a highest occupied molecular orbital HOMO($H^{B2}$) having an energy $EH^{OMO}(H^{B2})$) and a lowest unoccupied molecular orbital LUMO($H^{B2}$) having an energy $E^{LUMO}(H^{B2})$, wherein $E^{HOMO}(E^B)-E^{HOMO}(H^B) \leq 0.3$ eV and $E^{HOMO}(E^B)-E^{HOMO}(H^B) \geq -0.3$ eV; and $E^{LUMO}(E^B)-E^{LUMO}(H^{B2}) \leq 0.3$ eV and $E^{LUMO}(E^B)-E^{LUMO}(H^{B2}) \geq -0.3$ eV; and optionally $E^{HOMO}(S^B)-E^{HOMO}(H^B) \leq 0.3$ eV and $E^{HOMO}(S^B)-E^{HOMO}(H^B) \geq -0.3$ eV; and optionally $E^{LUMO}(E^B)-E^{LUMO}(H^{B2}) \leq 0.3$ eV and $E^{LUMO}(E^B)-E^{LUMO}(H^{B2}) \geq -0.3$ eV;

In a preferred embodiment, the emission layer B comprises the first TADF material $E^B$ and the second TADF material $S^B$, a mixed-host system comprising T2T as electron-dominant host $H^{B2}$ and a host $H^B$ selected from the group consisting of CBP, mCP, mCBP, 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole as hole-dominant host.

Orbital and excited state energies can be determined either by means of experimental methods known to the person skilled in the art. Experimentally, the energy of the highest occupied molecular orbital $E^{HOMO}$ is determined by methods known to the person skilled in the art from cyclic voltammetry measurements with an accuracy of 0.1 eV. The energy of the lowest unoccupied molecular orbital $E^{LUMO}$ is calculated as $E^{HOMO}+E^{gap}$, where $E^{gap}$ is determined as follows: For host compounds, the onset of emission of a film with 10% by weight of host in poly(methyl methacrylate) (PMMA) is used as $E^{gap}$, unless stated otherwise. For emitter compounds, $E^{gap}$ is determined as the energy at which the excitation and emission spectra of a film with 10% by weight of emitter in PMMA cross.

The energy of the first excited triplet state T1 is determined from the onset of emission at low temperature, typically at 77 K. For host compounds, where the first excited singlet state and the lowest triplet state are energetically separated by >0.4 eV, the phosphorescence is usually visible in steady-state spectra in 2-Me-THF. The triplet energy can thus be determined as the onset of the phosphorescence spectra. For TADF emitter compounds, the energy of the first excited triplet state T1 is determined from the onset of the delayed emission spectrum at 77 K, if not otherwise stated measured in a film of poly(methyl methacrylate) (PMMA) with 10% by weight of emitter. Both for host and emitter compounds, the energy of the first excited singlet state S1 is determined from the onset of the emission spectrum, if not otherwise stated, measured in a film of poly(methyl methacrylate) (PMMA) with 10% by weight of the respective host or emitter compound. Typically, this composition does not comprise further host or emitter compounds beside the one investigated.

In the electron transport layer (ETL, any electron transporter may be used. Exemplarily, compounds poor of electrons such as, e.g., benzimidazoles, pyridines, triazoles, oxadiazoles (e.g., 1,3,4-oxadiazole), phosphinoxides and sulfone, may be used. Exemplarily, an electron transporter $ETM^D$ may also be a star-shaped heterocycle such as 1,3,5-tri(1-phenyl-1H-benzo[d]imidazol-2-yl)phenyl (TPBi). The $ETM^D$ may exemplarily be NBphen (2,9-bis(naphthalen-2-yl)-4,7-diphenyl-1,10-phenanthroline), Alq3 (Aluminum-tris(8-hydroxyquinoline)), TSPO1 (diphenyl-4-triphenylsilylphenyl-phosphinoxide), BPyTP2 (2,7-di(2,2'-bipyridin-5-yl)triphenyle), Sif87 (dibenzo[b,d]thiophen-2-yltriphenylsilane), Sif88 (dibenzo[b,d]thiophen-2-yl)diphenylsilane), BmPyPhB (1,3-bis[3,5-di(pyridin-3-yl)phenyl]benzene) and/or BTB (4,4'-bis-[2-(4,6-diphenyl-1,3,5-triazinyl)]-1,1'-biphenyl). Optionally, the electron transport layer may be doped with materials such as Liq (8-hydroxyquinolinolatolithium). Optionally, a second electron transport layer may be located between electron transport layer and the cathode layer C.

Adjacent to the electron transport layer (ETL), a cathode layer C may be located. Exemplarily, the cathode layer C may comprise or may consist of a metal (e.g., Al, Au, Ag, Pt, Cu, Zn, Ni, Fe, Pb, LiF, Ca, Ba, Mg, In, W, or Pd) or a metal alloy. For practical reasons, the cathode layer C may also consist of (essentially) intransparent metals such as Mg, Ca or Al. Alternatively or additionally, the cathode layer C may also comprise graphite and or carbon nanotubes (CNTs). Alternatively, the cathode layer C may also consist of nanoscale silver wires.

An OLED may further, optionally, comprise a protection layer between the electron transport layer (ETL) D and the cathode layer C (which may be designated as electron injection layer (EIL)). This layer may comprise lithium fluoride, caesium fluoride, silver, Liq (8-hydroxyquinolinolatolithium), $Li_2O$, $BaF_2$, MgO and/or NaF. As used herein, if not defined more specifically in a particular context, the designation of the colors of emitted and/or absorbed light is as follows:

violet: wavelength range of >380-420 nm;
deep blue: wavelength range of >420-470 nm;
sky blue: wavelength range of >470-500 nm;
green: wavelength range of >500-560 nm;
yellow: wavelength range of >560-580 nm;
orange: wavelength range of >580-620 nm;
red: wavelength range of >620-800 nm.

With respect to emitter compounds, such colors refer to the emission maximum $\lambda_{max}^{PMMA}$ of a poly(methyl methacrylate) (PMMA) film with 10% by weight of the emitter. Therefore, exemplarily, a deep blue emitter has an emission maximum $\lambda_{max}^{PMMA}$ in the range of from 420 to 470 nm, a sky blue emitter has an emission maximum $\lambda_{max}^{PMMA}$ in the range of from 470 to 500 nm, a green emitter has an emission maximum $\lambda_{max}^{PMMA}$ in a range of from 500 to 560 nm, a red emitter has an emission maximum $\lambda_{max}^{PMMA}$ in a range of from 620 to 800 nm.

A deep blue emitter may preferably have an emission maximum $\lambda_{max}^{PMMA}$ of below 475 nm, more preferably below 470 nm, even more preferably below 465 nm or even below 460 nm. It will typically be above 420 nm, preferably above 430 nm, more preferably above 440 nm.

Accordingly, a further embodiment of the present invention relates to an OLED, which exhibits an external quantum efficiency at 1000 cd/m² of more than 10%, more preferably of more than 12%, more preferably of more than 15%, even more preferably of more than 17% or even more than 20% and/or exhibits an emission maximum between 420 nm and 500 nm, preferably between 430 nm and 490 nm, more preferably between 440 nm and 480 nm, even more preferably between 450 nm and 470 nm and/or exhibits a LT80 value at 500 cd/m² of more than 100 h, preferably more than 200 h, more preferably more than 400 h, even more preferably more than 750 h or even more than 1000 h.

A further embodiment of the present invention relates to an OLED, which emits light at a distinct color point. According to the present invention, the OLED emits light with a narrow emission band (small full width at half maximum (FWHM)). In a preferred embodiment, the OLED according to the invention emits light with a FWHM of the main emission peak of below 0.50 eV, more preferably of below 0.46 eV, even more preferably of below 0.43 eV or even below 0.41 eV.

A further aspect of the present invention relates to an OLED, which emits light with CIEx and CIEy color coordinates close to the CIEx (=0.131) and CIEy (=0.046) color coordinates of the primary color blue (CIEx=0.131 and CIEy=0.046) as defined by ITU-R Recommendation BT.2020 (Rec. 2020) and thus is suited for the use in Ultra High Definition (UHD) displays, e.g. UHD-TVs. In commercial applications, typically top-emitting (top-electrode is transparent) devices are used, whereas test devices as used throughout the present application represent bottom-emitting devices (bottom-electrode and substrate are transparent). The CIEy color coordinate of a blue device can be reduced by up to a factor of two, when changing from a bottom- to a top-emitting device, while the CIEx remains nearly unchanged (Okinaka et al. doi:10.1002/sdtp.10480). Accordingly, a further aspect of the present invention relates to an OLED, whose emission exhibits a CIEx color coordinate of between 0.02 and 0.30, preferably between 0.03 and 0.25, more preferably between 0.05 and 0.20 or even more preferably between 0.08 and 0.18 or even between 0.10 and 0.15 and/or a CIEy color coordinate of between 0.00 and 0.45, preferably between 0.01 and 0.30, more preferably between 0.02 and 0.20 or even more preferably between 0.03 and 0.15 or even between 0.04 and 0.10.

In one embodiment of the invention, the second TADF material $S^B$ exhibits an emission maximum $\lambda_{max}^{PMMA}(S^B)$ and the first TADF material $E^B$ exhibits an emission maximum $\lambda_{max}^{PMMA}(E^B)$, wherein 500 nm $\geq \lambda_{max}^{PMMA}(S^B) > \lambda_{max}^{PMMA}(E^B)$.

In a more preferred embodiment, the second TADF material $S^B$ exhibits an emission maximum $\lambda_{max}^{PMMA}(S^B)$ and the first TADF material $E^B$ exhibits an emission maximum $\lambda_{max}^{PMMA}(E^B)$, wherein 480 nm $\geq \lambda_{max}^{PMMA}(S^B) > \lambda_{max}^{PMMA}(E^B)$.

In a preferred embodiment, the first TADF material $E^B$ exhibits an emission maximum $\lambda_{max}^{PMMA}(E^B)$ in the range of from 450 to 470 nm (i.e., 470 nm $\geq \lambda_{max}^{PMMA}(E^B) \geq 450$ nm).

In a preferred embodiment, the second TADF material $S^B$ exhibits an emission maximum $\lambda_{max}^{PMMA}(S^B)$, the first TADF material $E^B$ exhibits an emission maximum $\lambda_{max}^{PMMA}(E^B)$ and the device exhibits an emission maximum $\lambda_{max}(D)$, wherein $\lambda_{max}^{PMMA}(S^B) > \lambda_{max}(D) \geq \lambda_{max}^{PMMA}(E^B)$.

Due to the layer design the emission of the device can be even further shifted to the blue. Accordingly in a further embodiment of the invention, the second TADF material $S^B$ exhibits an emission maximum $\lambda_{max}^{PMMA}(S^B)$, the first TADF material $E^B$ exhibits an emission maximum $\lambda_{max}^{PMMA}(E^B)$ and the device exhibits an emission maximum $\lambda_{max}(D)$, wherein $\lambda_{max}^{PMMA}(S^B) > \lambda_{max}^{PMMA}(E^B) > \lambda_{max}(D)$.

In a preferred embodiment, the first TADF material $E^B$ and the second TADF material $S^B$ are independently from another both chosen from molecules of a structure of Formula I

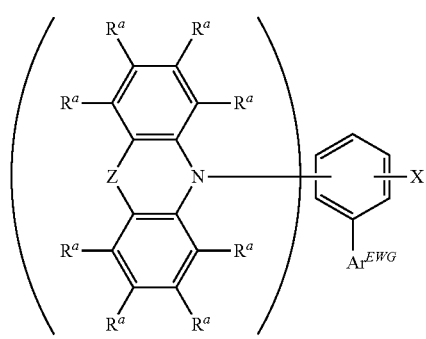

Formula I wherein
n is at each occurrence independently from another 1 or 2;

X is at each occurrence independently from another selected CN or $CF_3$,

Z is at each occurrence independently from another selected from the group consisting of a direct bond, $CR^3R^4$, $C=CR^3R^4$, $C=O$, $C=NR^3$, $NR^3$, O, $SiR^3R^4$, S, S(O) and $S(O)_2$;

$Ar^{EWG}$ is at each occurrence independently from another a structure according to one of Formulas IIa to IIi

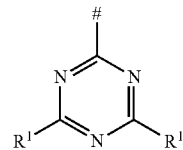

Formula IIa

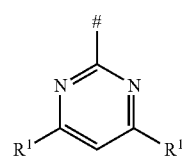

Formula IIb

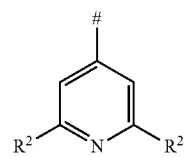

Formula IIc

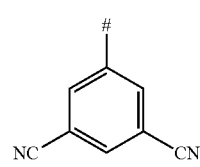

Formula IId

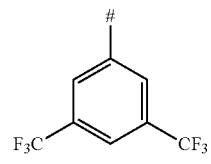

Formula IIe

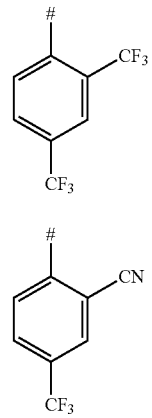

Formula IIf

Formula IIg

-continued

Formula IIh

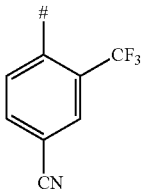

Formula IIi

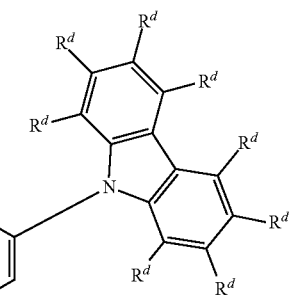

wherein # represents the binding site of the single bond linking $Ar^{EWG}$ to the substituted central phenyl ring of Formula I;

$R^1$ is at each occurrence independently from another selected from the group consisting of hydrogen, deuterium, $C_1$-$C_5$-alkyl, wherein one or more hydrogen atoms are optionally substituted by deuterium, and $C_6$-$C_{18}$-aryl, which is optionally substituted with one or more substituents $R^6$;

$R^2$ is at each occurrence independently from another selected from the group consisting of hydrogen, deuterium, $C_1$-$C_5$-alkyl, wherein one or more hydrogen atoms are optionally substituted by deuterium, and $C_6$-$C_{18}$-aryl, which is optionally substituted with one or more substituents $R^6$;

$R^a$, $R^3$ and $R^4$ is at each occurrence independently from another selected from the group consisting of hydrogen, deuterium, $N(R^5)_2$, $OR^5$, $SR^5$, $Si(R^5)_3$, $CF_3$, CN, F, $C_1$-$C_{40}$-alkyl which is optionally substituted with one or more substituents $R^5$ and wherein one or more non-adjacent $CH_2$-groups are optionally substituted by $R^5C$=$CR^5$, C≡C, $Si(R^5)_2$, $Ge(R^5)_2$, $Sn(R^5)_2$, C=O, C=S, C=Se, C=$NR^5$, P(=O)($R^5$), SO, $SO_2$, $NR^5$, O, S or $CONR^5$;

$C_1$-$C_{40}$-thioalkoxy which is optionally substituted with one or more substituents $R^5$ and wherein one or more non-adjacent $CH_2$-groups are optionally substituted by $R^5C$=$CR^5$, C≡C, $Si(R^5)_2$, $Ge(R^5)_2$, $Sn(R^5)_2$, C=O, C=S, C=Se, C=$NR^5$, P(=O)($R^5$), SO, $SO_2$, $NR^5$, O, S or $CONR^5$; and $C_6$-$C_{60}$-aryl which is optionally substituted with one or more substituents $R^5$; $C_3$-$C_{57}$-heteroaryl which is optionally substituted with one or more substituents $R^5$;

$R^5$ is at each occurrence independently from another selected from the group consisting of hydrogen, deuterium, $N(R^6)_2$, $OR^6$, $SR^6$, $Si(R^6)_3$, $CF_3$, CN, F, $C_1$-$C_{40}$-alkyl which is optionally substituted with one or more substituents $R^6$ and wherein one or more non-adjacent $CH_2$-groups are optionally substituted by $R^6C$=$CR^6$, C≡C, $Si(R^6)_2$, $Ge(R^6)_2$, $Sn(R^6)_2$, C=O, C=S, C=Se, C=$NR^6$, P(=O)($R^6$), SO, $SO_2$, $NR^6$, O, S or $CONR^6$, $C_6$-$C_{60}$-aryl which is optionally substituted with one or more substituents $R^6$; and $C_3$-$C_{57}$-heteroaryl which is optionally substituted with one or more substituents $R^6$;

$R^6$ is at each occurrence independently from another selected from the group consisting of hydrogen, deuterium, OPh, $CF_3$, CN, F, $C_1$-$C_5$-alkyl, wherein one or more hydrogen atoms are optionally, independently from each other substituted by deuterium, CN, $CF_3$, or F; $C_1$-$C_5$-alkoxy, wherein one or more hydrogen atoms are optionally, independently from each other substituted by deuterium, CN, $CF_3$, or F;

$C_1$-$C_5$-thioalkoxy, wherein one or more hydrogen atoms are optionally, independently from each other substituted by deuterium, CN, $CF_3$, or F;

$C_6$-$C_{18}$-aryl which is optionally substituted with one or more $C_1$-$C_5$-alkyl substituents;

$C_3$-$C_{17}$-heteroaryl which is optionally substituted with one or more $C_1$-$C_5$-alkyl substituents;

$N(C_6$-$C_{18}$-aryl$)_2$, $N(C_3$-$C_{17}$-heteroaryl$)_2$, and $N(C_3$-$C_{17}$-heteroaryl)($C_6$-$C_{18}$-aryl), $R^d$ is at each occurrence independently from another selected from the group consisting of hydrogen, deuterium, $N(R^5)_2$, $OR^5$, $SR^5$, $Si(R^5)_3$, $CF_3$, CN, F, $C_1$-$C_{40}$-alkyl which is optionally substituted with one or more substituents $R^5$ and wherein one or more non-adjacent $CH_2$-groups are optionally substituted by $R^5C$=$CR^5$, C≡C, $Si(R^5)_2$, $Ge(R^5)_2$, $Sn(R^5)_2$, C=O, C=S, C=Se, C=$NR^5$, P(=O)($R^5$), SO, $SO_2$, $NR^5$, O, S or $CONR^5$, $C_1$-$C_{40}$-thioalkoxy which is optionally substituted with one or more substituents $R^5$ and wherein one or more non-adjacent $CH_2$-groups are optionally substituted by $R^5C$=$CR^5$, C≡C, $Si(R^5)_2$, $Ge(R^5)_2$, $Sn(R^5)_2$, C=O, C=S, C=Se, C=$NR^5$, P(=O)($R^5$), SO, $SO_2$, $NR^5$, O, S or $CONR^5$, and $C_6$-$C_{60}$-aryl which is optionally substituted with one or more substituents $R^5$; $C_3$-$C_{57}$-heteroaryl which is optionally substituted with one or more substituents wherein the substituents $R^a$, $R^3$, $R^4$ or $R^5$ independently from each other optionally may form a mono- or polycyclic, aliphatic, aromatic and/or benzo-fused ring system with one or more substituents $R^a$, $R^3$, $R^4$ or $R^5$ and wherein the one or more substituents $R^d$ independently from each other optionally may form a mono- or polycyclic, aliphatic, aromatic and/or benzo-fused ring system with one or more substituents $R^d$.

According to the invention, the substituents $R^a$, $R^3$, $R^4$ or $R^5$ at each each occurrence independently from each other may optionally form a mono- or polycyclic, aliphatic, aromatic and/or benzo-fused ring system with one or more substituents $R^a$, $R^3$, $R^4$ or $R^5$.

According to the invention, the substituents $R^d$ at each each occurrence independently from each other may optionally form a mono- or polycyclic, aliphatic, aromatic and/or benzo-fused ring system with one or more other substituents $R^d$.

In a preferred embodiment of the invention, the first TADF material $E^B$ and the second TADF material $S^B$ both bear the same structure according to Formula I structurally only differing in one or more of $R^a$, $R^1$, $R^2$ and X. In other words, both TADF materials $S^B$ and $E^B$ may bear the same structure according to Formula I and differ in at least one substituent chosen from the group consisting of $R^a$, $R^1$, $R^2$ and X.

In a preferred embodiment of the invention, $S^B$ and $E^B$ comprise or consist of the same structure according to Formula I and differ in one or more substituents $R^a$. In the following table, exemplarily $S^B$ and $E^B$ pairs according to this embodiment (each line representing an exemplified pair) are listed:

| $S^B$ | $E^B$ |
|---|---|
| 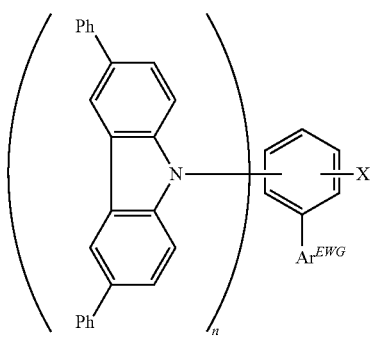 | 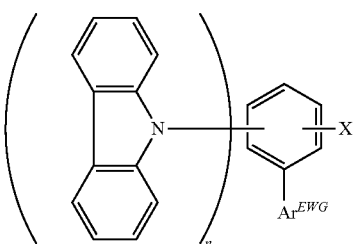 |
| 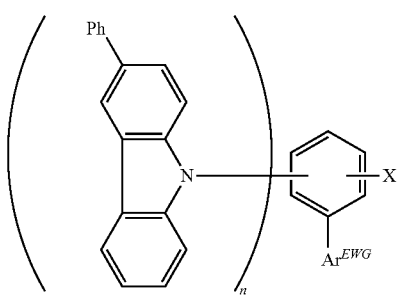 | 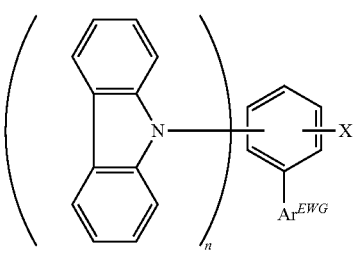 |
| 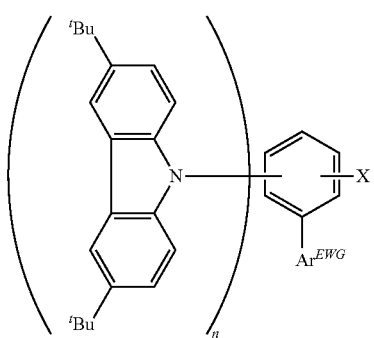 | 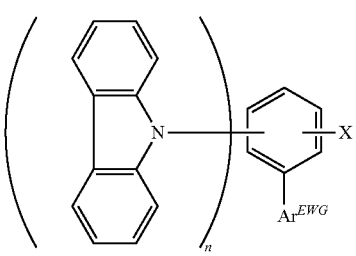 |
| 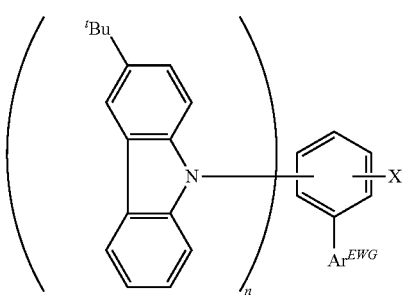 | 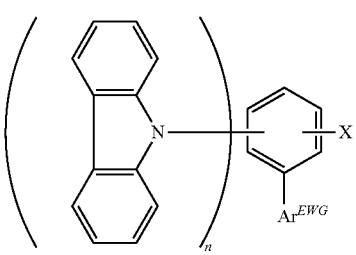 |

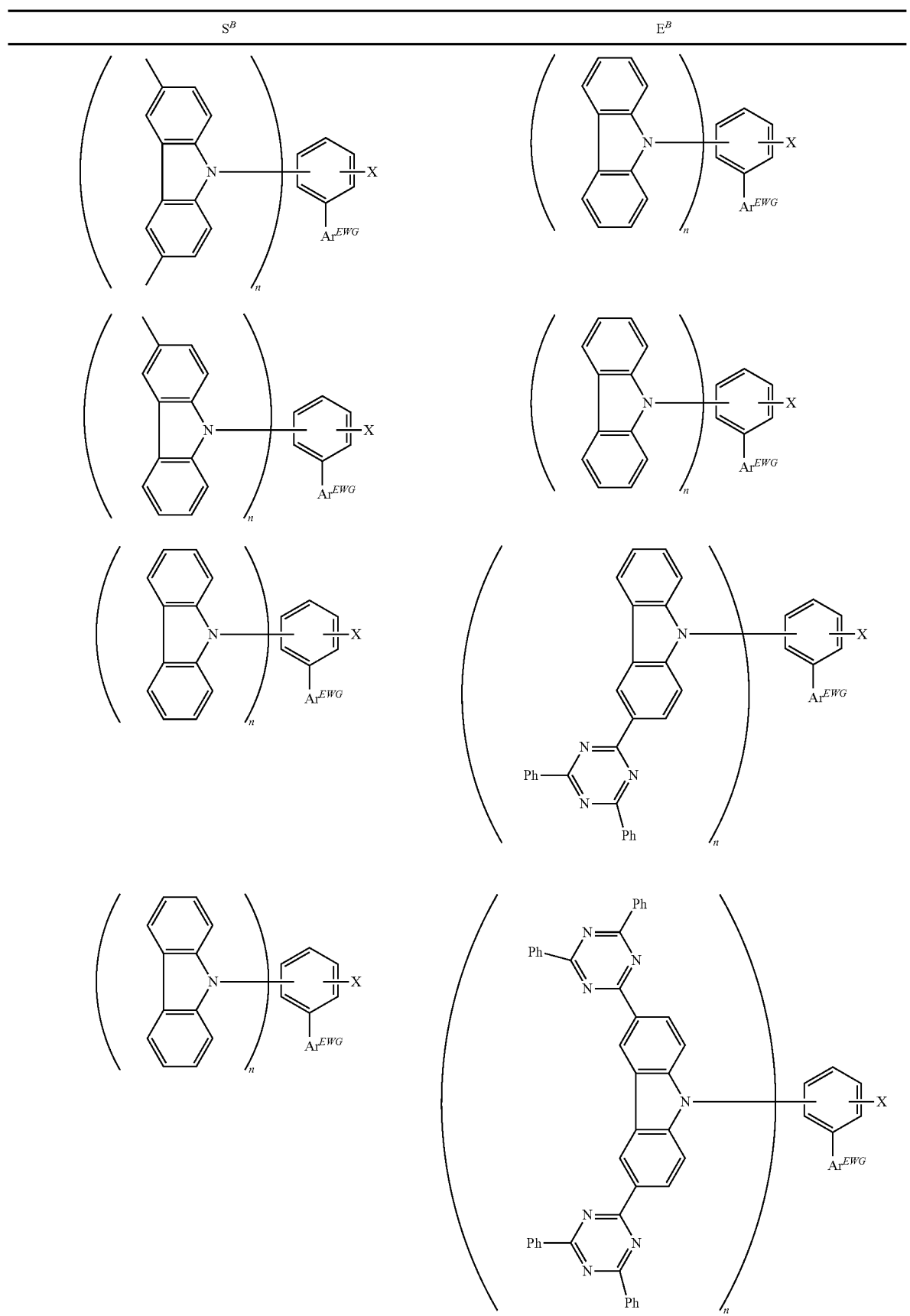

-continued
| $S^B$ | $E^B$ |
|---|---|
| 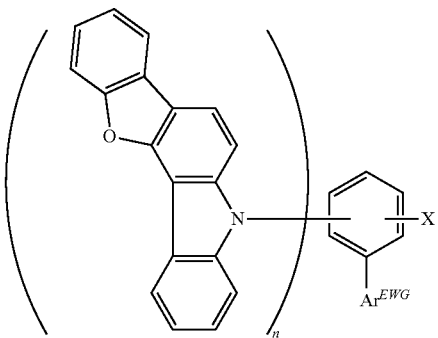 | 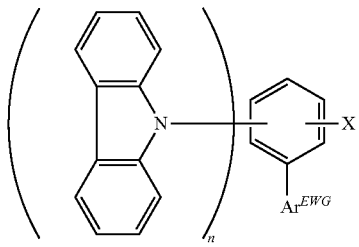 |
| 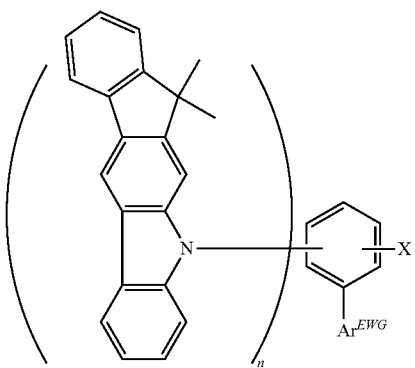 | 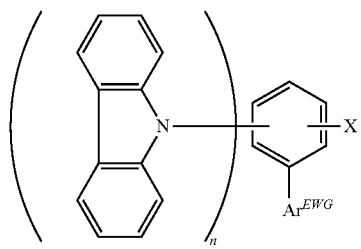 |
| 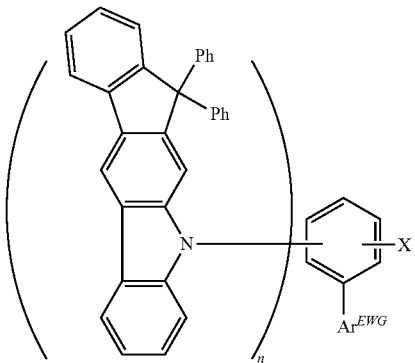 | 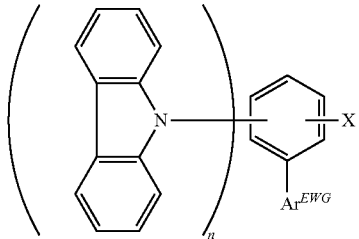 |
| 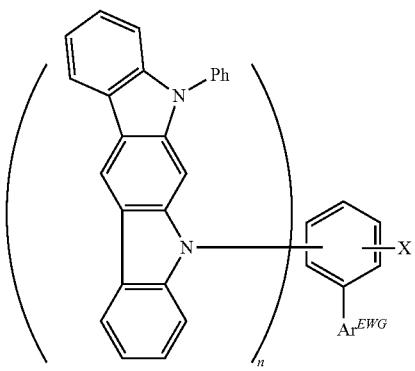 | 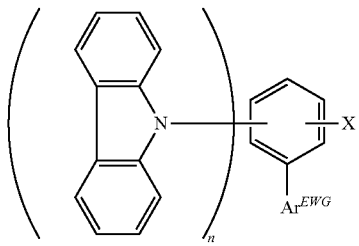 |

| $S^B$ | $E^B$ |
|---|---|

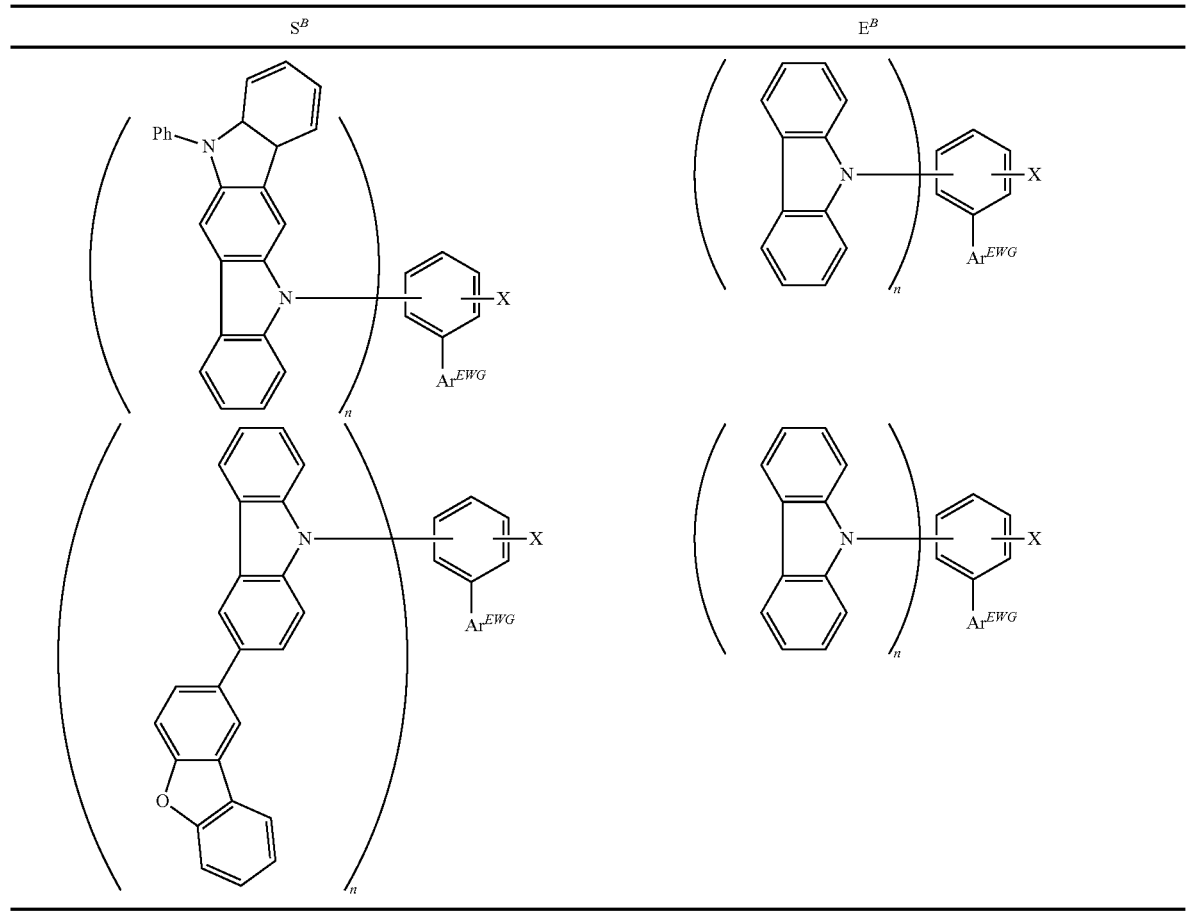

wherein $Ar^{EWG}$ and X are defined as above.

In one embodiment of the invention, $S^B$ and $E^B$ bear the same structure according to Formula IIa to Formula IIi and (only) differ in the substitution pattern of the substituted central phenyl ring of Formula I. Accordingly, In a preferred embodiment, $S^B$ and $E^B$ (only) differ in that residue X is defined differently. In another embodiment, $S^B$ and $E^B$ (only) differ in that residue n is defined differently. In another embodiment, $S^B$ and $E^B$ (only) differ in that residues n and X are each defined differently. It will be understood that the further residues may be defined as above and may be in particular defined according to any exemplified structures and/or embodiments.

In a particularly preferred embodiment of the invention, Z is a direct bond at each occurrence. Particularly preferred, Z is a direct bond at each occurrence in both TADF materials $S^B$ and $E^B$.

In one embodiment of the invention, $R^a$ is at each occurrence independently from another selected from the group consisting of hydrogen, deuterium, Me, $^iPr$, $^tBu$, CN, $CF_3$, Ph, which is optionally substituted with one or more substituents independently from each other selected from the group consisting of Me, $^iPr$, $^tBu$, CN, $CF_3$ and Ph;

pyridinyl, which is optionally substituted with one or more substituents independently from each other selected from the group consisting of Me, $^iPr$, $^tBu$, CN, $CF_3$ and Ph;

pyrimidinyl, which is optionally substituted with one or more substituents independently from each other selected from the group consisting of Me, $^iPr$, $^tBu$, CN, $CF_3$ and Ph;

carbazolyl, which is optionally substituted with one or more substituents independently from each other selected from the group consisting of Me, $^iPr$, $^tBu$, CN, $CF_3$ and Ph;

triazinyl, which is optionally substituted with one or more substituents independently from each other selected from the group consisting of Me, $^iPr$, $^tBu$, CN, $CF_3$ and Ph; and $N(Ph)_2$.

In one embodiment of the invention, $R^d$ is at each occurrence independently from another selected from the group consisting of hydrogen, deuterium, Me, $^iPr$, $^tBu$, CN, $CF_3$, Ph, which is optionally substituted with one or more substituents independently from each other selected from the group consisting of Me, $^iPr$, $^tBu$, CN, $CF_3$ and Ph;

pyridinyl, which is optionally substituted with one or more substituents independently from each other selected from the group consisting of Me, $^iPr$, $^tBu$, CN, $CF_3$ and Ph;

pyrimidinyl, which is optionally substituted with one or more substituents independently from each other selected from the group consisting of Me, $^iPr$, $^tBu$, CN, $CF_3$ and Ph;

carbazolyl, which is optionally substituted with one or more substituents independently from each other selected from the group consisting of Me, $^iPr$, $^tBu$, CN, $CF_3$ and Ph;

triazinyl, which is optionally substituted with one or more substituents independently from each other selected from the group consisting of Me, $^iPr$, $^tBu$, CN, $CF_3$ and Ph; and $N(Ph)_2$.

In a preferred embodiment, X is CN. Preferably, X may be CN in both occurrence in both TADF materials $S^B$ and $E^B$.

In one embodiment of the invention, the TADF materials $S^B$ and $E^B$ are independently from another both chosen from molecules of a structure of Formula III:

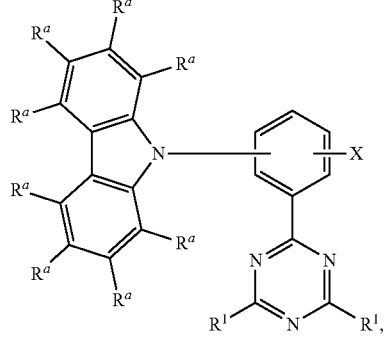

(Formula III)

wherein $R^a$, X and $R^1$ are defined as above.

In one embodiment of the invention, $S^B$ and $E^B$ are independently from another both chosen from molecules of a structure of Formula IIIa:

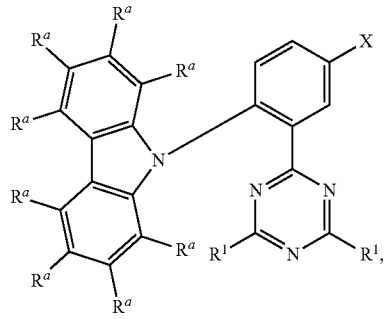

(Formula IIIa)

wherein $R^a$, X and $R^1$ are defined as above. In one embodiment of the invention, $S^B$ and $E^B$ are independently from another both chosen from molecules of a structure of Formula IIIb:

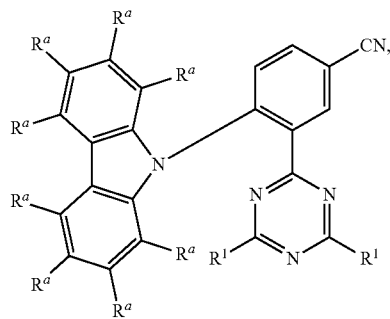

(Formula IIIb)

wherein $R^a$ and $R^1$ are defined as above.

In one embodiment of the invention, $S^B$ and $E^B$ are independently from another both chosen from molecules of a structure of Formula IV:

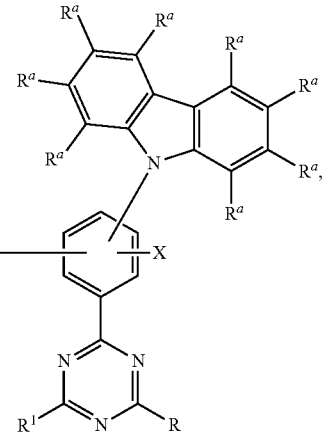

(Formula IV)

wherein $R^a$, $R^1$ and X are defined as above.

In one embodiment of the invention, $S^B$ and $E^B$ are independently from another both chosen from molecules of a structure of Formula IVa:

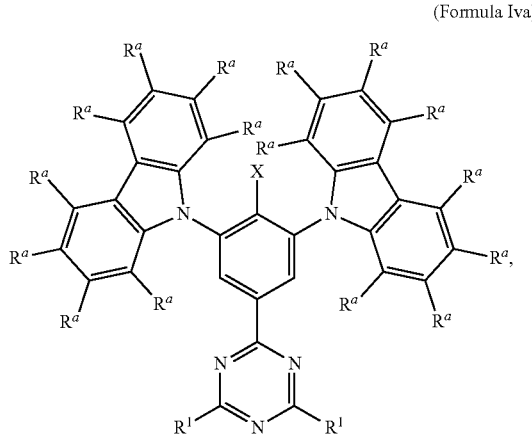

(Formula Iva)

wherein $R^a$, $R^1$ and X are defined as above.

In one embodiment of the invention, $S^B$ and $E^B$ are independently from another both chosen from molecules of a structure of Formula IVb:

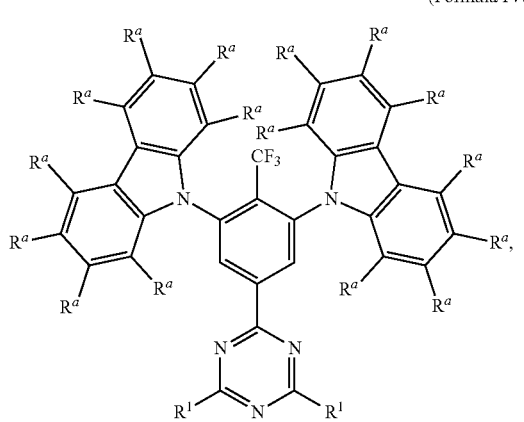

(Formula IVb)

wherein $R^a$ and $R^1$ are defined as above.

In one embodiment of the invention, $S^B$ and $E^B$ are independently from another both chosen from molecules of a structure of Formula V:

(Formula V)

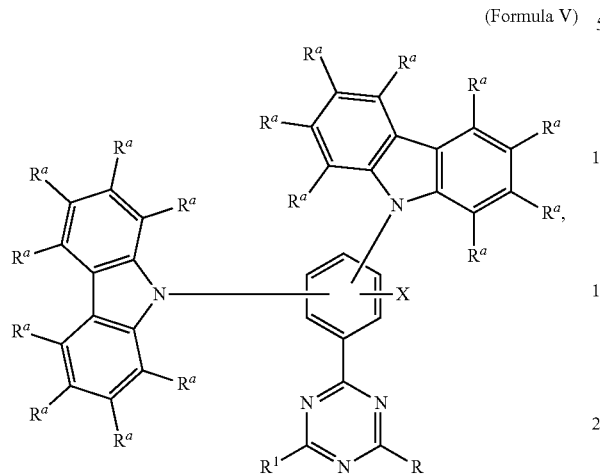

wherein $R^a$, $R^1$ and X are defined as above.

In one embodiment of the invention, $S^B$ and $E^B$ are independently from another both chosen from molecules of a structure of Formula Va:

(Formula Va)

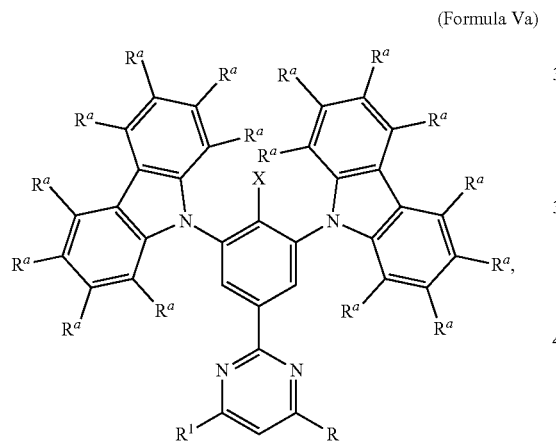

wherein $R^a$, $R^1$ and X are defined as above.

In one embodiment of the invention, $S^B$ and $E^B$ are independently from another both chosen from molecules of a structure of Formula Vb:

(Formula Vb)

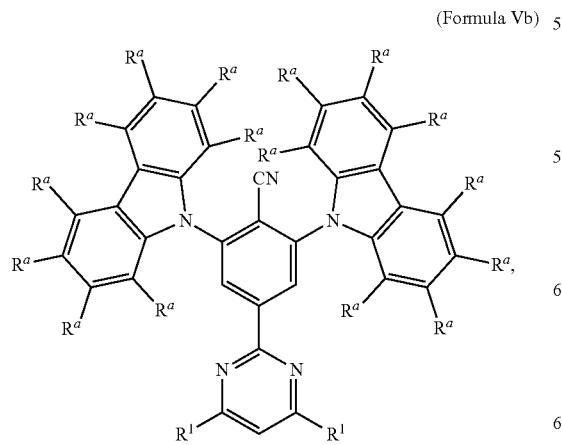

wherein $R^a$ and $R^1$ are defined as above.

In one embodiment of the invention, $S^B$ and $E^B$ are independently from another both chosen from molecules of a structure of Formula VI:

(Formula VI)

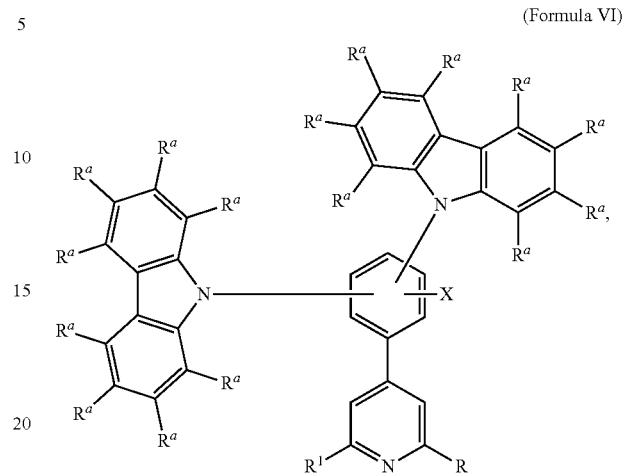

wherein $R^a$, $R^1$ and X are defined as above.

In one embodiment of the invention, $S^B$ and $E^B$ are independently from another both chosen from molecules of a structure of Formula VIa:

(Formula VIa)

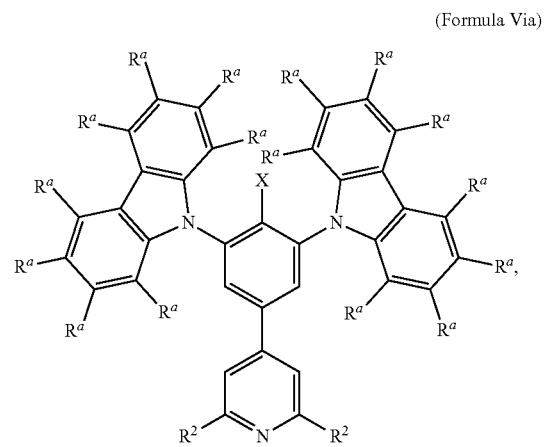

wherein $R^a$, $R^1$ and X are defined as above.

In one embodiment of the invention, $S^B$ and $E^B$ are independently from another both chosen from molecules of a structure of Formula VIb:

(Formula VIb)

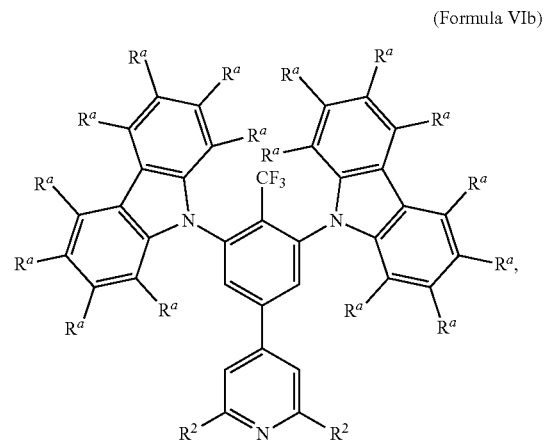

wherein $R^a$ and $R^1$ are defined as above.

In one embodiment of the invention, $S^B$ and $E^B$ are independently from another both chosen from molecules of a structure of Formula VII:

(Formula VII)

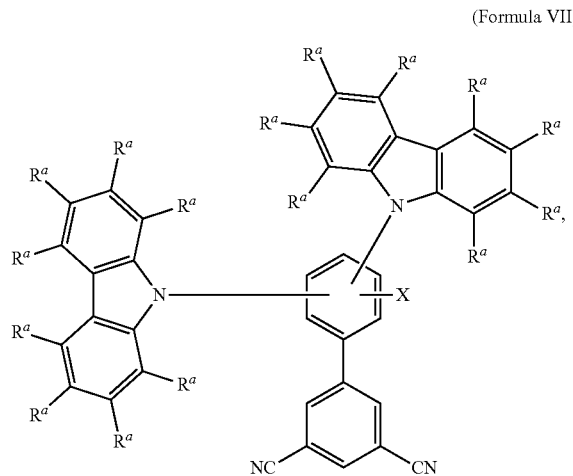

wherein $R^a$ and X are defined as above.

In one embodiment of the invention, $S^B$ and $E^B$ are independently from another both chosen from molecules of a structure of Formula VIIa:

(Formula VIIa)

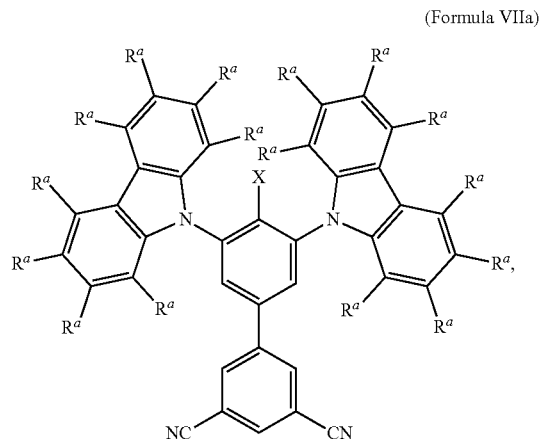

wherein $R^a$ and X are defined as above.

In one embodiment of the invention, $S^B$ and $E^B$ are independently from another both chosen from molecules of a structure of Formula VIIb:

(Formula VIIb)

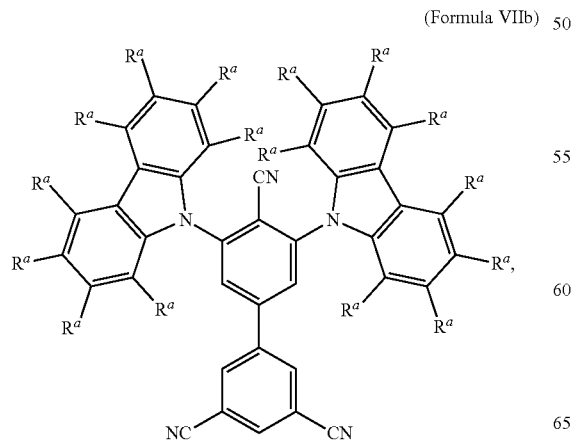

wherein $R^a$ is defined as above.

In one embodiment of the invention, $S^B$ and $E^B$ are independently from another both chosen from molecules of a structure of Formula VIII:

(Formula VIII)

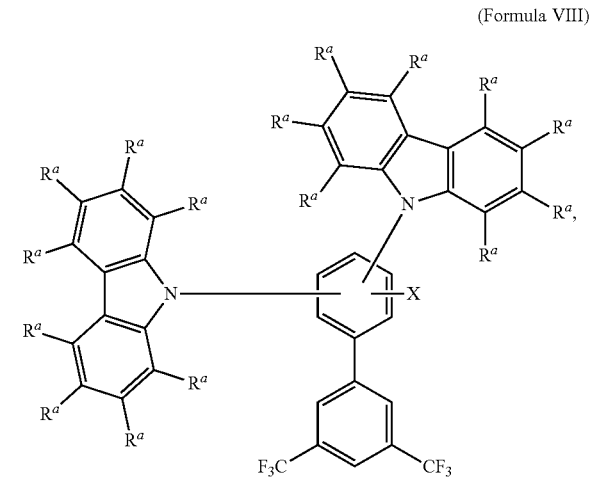

wherein $R^a$ and X are defined as above.

In one embodiment of the invention, $S^B$ and $E^B$ are independently from another both chosen from molecules of a structure of Formula VIIIa:

(Formula VIIIa)

wherein $R^a$ and X are defined as above.

In one embodiment of the invention, $S^B$ and $E^B$ are independently from another both chosen from molecules of a structure of Formula VIIIb:

(Formula VIIIb)

wherein $R^a$ is defined as above.

In one embodiment of the invention, $S^B$ and $E^B$ are independently from another both chosen from molecules of a structure of Formula IX:

(Formula IX)

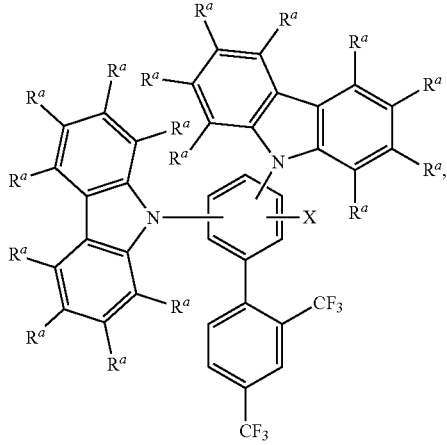

wherein $R^a$ and X are defined as above.

In one embodiment of the invention, $S^B$ and $E^B$ are independently from another both chosen from molecules of a structure of Formula IXa:

(Formula IXa)

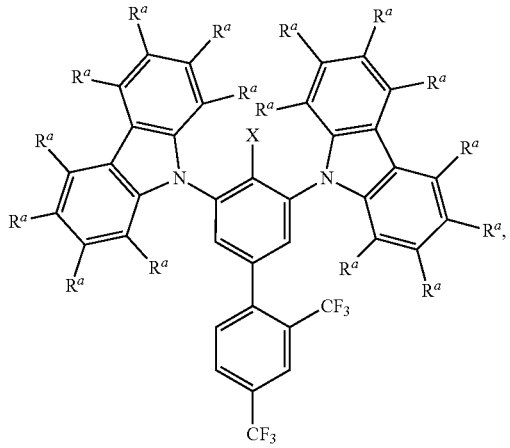

wherein $R^a$ and X are defined as above.

In one embodiment of the invention, $S^B$ and $E^B$ are independently from another both chosen from molecules of a structure of Formula IXb:

(Formula IXb)

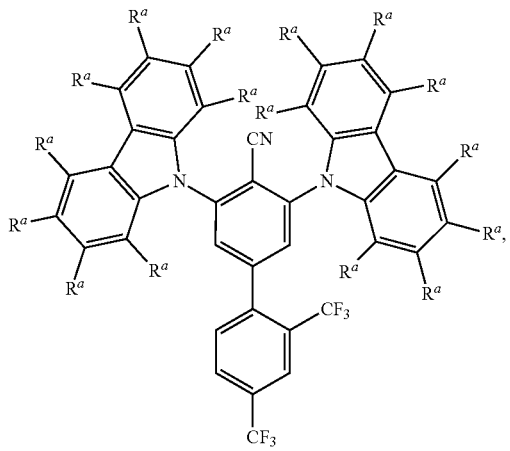

wherein $R^a$ is defined as above.

In one embodiment of the invention, $S^B$ and $E^B$ are independently from another both chosen from molecules of a structure of Formula X:

(Formula X)

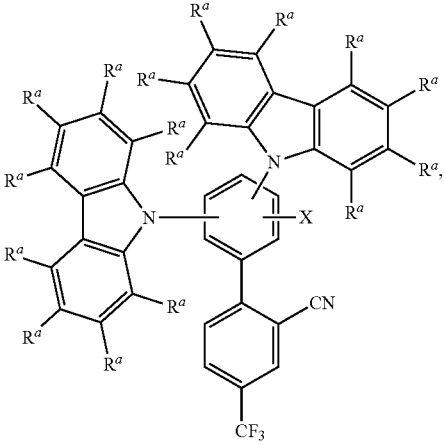

wherein $R^a$ and X are defined as above.

In one embodiment of the invention, $S^B$ and $E^B$ are independently from another both chosen from molecules of a structure of Formula Xa:

(Formula Xa)

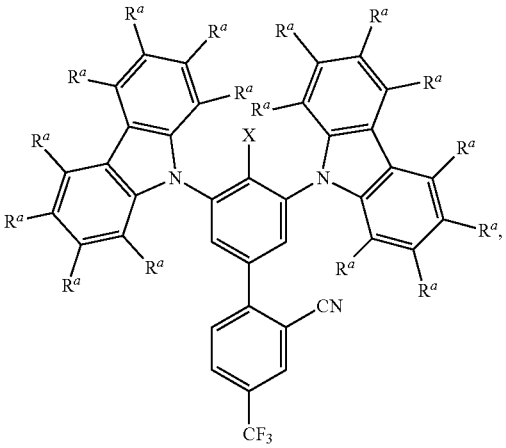

wherein $R^a$ and X are defined as above.

In one embodiment of the invention, $S^B$ and $E^B$ are independently from another both chosen from molecules of a structure of Formula Xb:

(Formula Xb)

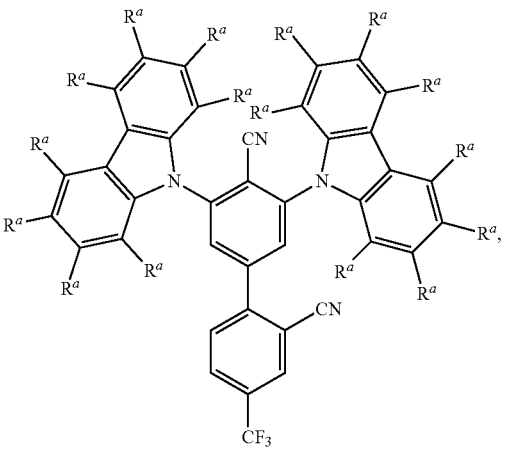

wherein $^a$ is defined as above.

In one embodiment of the invention, $S^B$ and $E^B$ are independently from another both chosen from molecules of a structure of Formula XI:

(Formula XI)

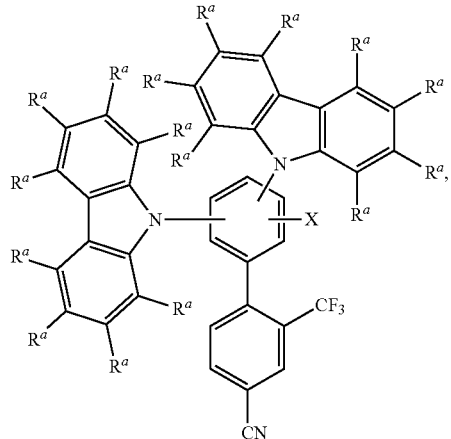

wherein $R^a$ and X are defined as above.

In one embodiment of the invention, $S^B$ and $E^B$ are independently from another both chosen from molecules of a structure of Formula XIa:

(Formula XIa)

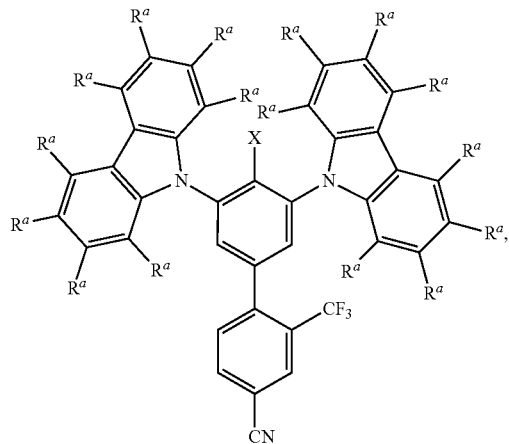

wherein $R^a$ and X are defined as above.

In one embodiment of the invention, $S^B$ and $E^B$ are independently from another both chosen from molecules of a structure of Formula XIb:

(Formula XIb)

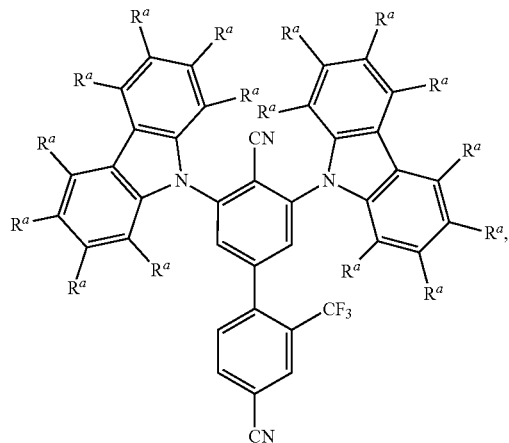

wherein $R^a$ is defined as above.

In one embodiment of the invention, $S^B$ and $E^B$ are independently from another both chosen from molecules of a structure of Formula XII:

(Formula XII)

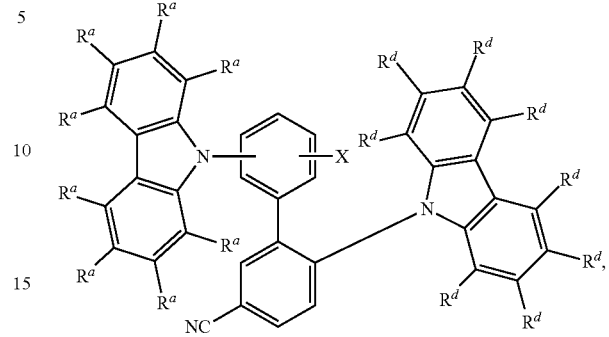

wherein $R^a$, X and $R^d$ are defined as above.

In one embodiment of the invention, $S^B$ and $E^B$ are independently from another both chosen from molecules of a structure of Formula XIIa:

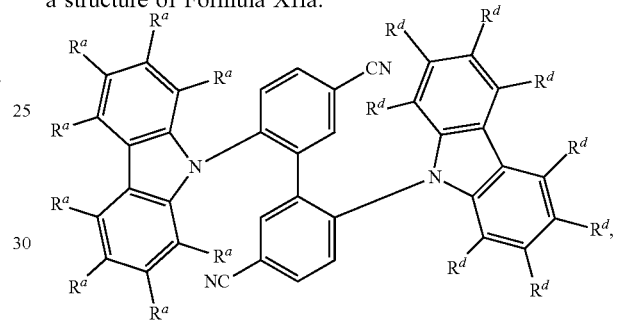

wherein $R^a$, X and $R^d$ are defined as above.

The synthesis of the molecules of a structure of Formula I can be accomplished via standard reactions and reaction conditions known to the skilled artesian. Typically, in a first step a coupling reaction, preferably a palladium catalyzed coupling reaction, is performed.

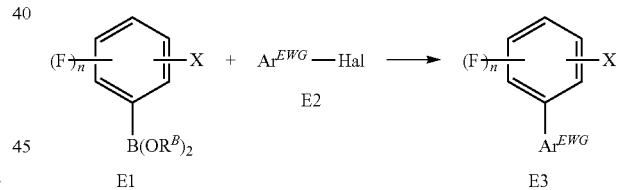

E1 can be any boronic acid ($R^b$=H) or an equivalent boronic acid ester ($R^b$=alkyl or aryl), in particular two $R^B$ form a ring to give e.g. boronic acid pinacol esters, of fluoro-(trifluoromethyl)phenyl, difluoro-(trifluoromethyl)phenyl, fluoro-(cyano)phenyl or difluoro-(cyano)phenyl. As second reactant E2 preferably $Ar^{EWG}$—Br is used. Reaction conditions of such palladium catalyzed coupling reactions are known the person skilled in the art, e.g. from WO 2017/005699, and it is known that the reacting groups of E1 and E2 can be interchanged to optimize the reaction yields.

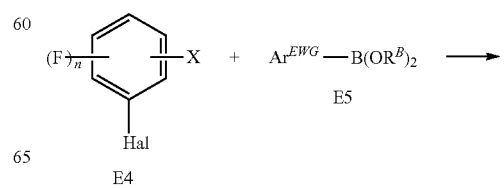

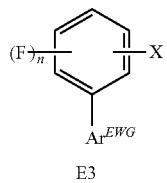

E3

In a second step, the molecules according to Formular I are obtained via the reaction of a nitrogen heterocycle in a nucleophilic aromatic substitution with the aryl halide, preferably aryl fluoride, or aryl dihalide, preferably aryl difluoride, E3. Typical conditions include the use of a base, such as tribasic potassium phosphate or sodium hydride, for example, in an aprotic polar solvent, such as dimethyl sulfoxide (DMSO) or N,N-dimethylformamide (DMF), for example.

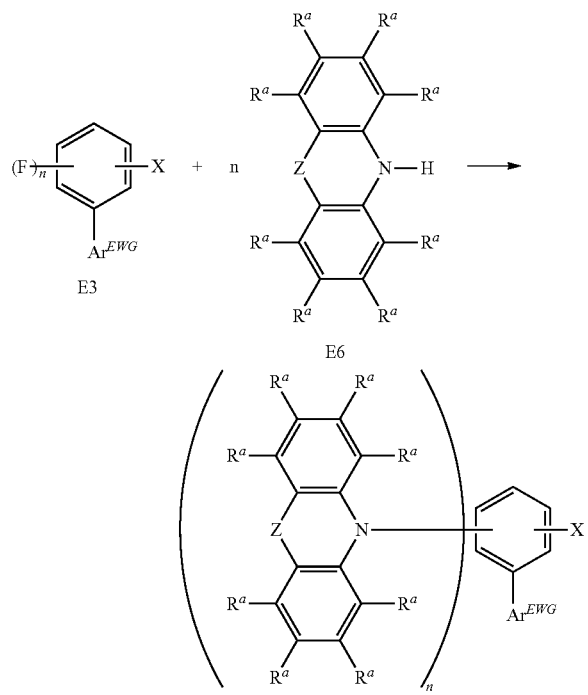

In particular, the donor molecule E6 is a 3,6-substituted carbazole (e.g., 3,6-dimethylcarbazole, 3,6 diphenylcarbazole, 3,6-di-tert-butylcarbazole), a 2,7-substituted carbazole (e.g., 2,7 dimethylcarbazole, 2,7-diphenylcarbazole, 2,7-di-tert-butylcarbazole), a 1,8-substituted carbazole (e.g., 1,8-dimethylcarbazole, 1,8-diphenylcarbazole, 1,8-di-tert-butylcarbazole), a 1 substituted carbazole (e.g., 1-methylcarbazole, 1-phenylcarbazole, 1-tert-butylcarbazole), a 2 substituted carbazole (e.g., 2-methylcarbazole, 2-phenylcarbazole, 2-tert-butylcarbazole), or a 3 substituted carbazole (e.g., 3-methylcarbazole, 3-phenylcarbazole, 3-tert-butylcarbazole).

Alternatively, a halogen-substituted carbazole, particularly 3-bromocarbazole, can be used as E6.

In a subsequent reaction a boronic acid ester functional group or boronic acid functional group may be exemplarily introduced at the position of the one or more halogen substituents, which was introduced via E6, to yield the corresponding carbazol-3-ylboronic acid ester or carbazol-3-ylboronic acid, e.g., via the reaction with bis(pinacolato) diboron (CAS No. 73183-34-3). Subsequently, one or more substituents $R^a$ may be introduced in place of the boronic acid ester group or the boronic acid group via a coupling reaction with the corresponding halogenated reactant $R^a$-Hal, preferably $R^a$—Cl and $R^a$—Br.

Alternatively, one or more substituents $R^a$ may be introduced at the position of the one or more halogen substituents, which was introduced via D-H, via the reaction with a boronic acid of the substituent $R^a$ [$R^a$—B(OH)$_2$] or a corresponding boronic acid ester.

An alternative synthesis route comprises the introduction of a nitrogen heterocycle via copper-or palladium-catalyzed coupling to an aryl halide or aryl pseudohalide, preferably an aryl bromide, an aryl iodide, aryl triflate or an aryl tosylate.

As used throughout the present application, the terms "aryl" and "aromatic" may be understood in the broadest sense as any mono-, bi- or polycyclic aromatic moieties. If not otherwise indicated, an aryl may also be optionally substituted by one or more substituents which are exemplified further throughout the present application. Accordingly, the term "arylene" refers to a divalent residue that bears two binding sites to other molecular structures and thereby serving as a linker structure. As used throughout the present application, the terms "heteroaryl" and "heteroaromatic" may be understood in the broadest sense as any mono-, bi- or polycyclic heteroaromatic moieties that include at least one heteroatom, in particular which bear from one to three heteroatoms per aromatic ring. Exemplarily, a heteroaromatic compound may be pyrrole, furan, thiophene, imidazole, oxazole, thiazole, triazole, pyrazole, pyridine, pyrazine and pyrimidine, and the like. If not otherwise indicated, a heteroaryl may also be optionally substituted by one or more substituents which are exemplified further throughout the present application. Accordingly, the term "heteroarylene" refers to a divalent residue that bears two binding sites to other molecular structures and thereby serving as a linker structure.

As used throughout the present application, the term "alkyl" may be understood in the broadest sense as both, linear or branched chain alkyl residue. Preferred alkyl residues are those containing from one to fifteen carbon atoms. Exemplarily, an alkyl residue may be methyl, ethyl, propyl, isopropyl, butyl, isobutyl, tert-butyl, and the like. If not otherwise indicated, an alkyl may also be optionally substituted by one or more substituents which are exemplified further throughout the present application. Accordingly, the term "alkylene" refers to a divalent residue that bears two binding sites to other molecular structures and thereby serving as a linker structure.

If not otherwise indicated, as used herein, in particular in the context of aryl, arylene, heteroaryl, alkyl and the like, the term "substituted" may be understood in the broadest sense. Preferably, such substitution means a residue selected from the group consisting of $C_1$-$C_{20}$-alkyl, $C_7$-$C_{19}$-alkaryl, and $C_6$-$C_{18}$-aryl. Accordingly, preferably, no charged moiety, more preferably no functional group is present in such substitution.

It will be noticed that hydrogen can, at each occurrence, be replaced by deuterium.

Unless otherwise specified, any of the layers of the various embodiments may be deposited by any suitable method. The layers in the context of the present invention, including the light-emitting layer B, may optionally be prepared by means of liquid processing (also designated as "film processing", "fluid processing", "solution processing" or "solvent processing"). This means that the components comprised in the respective layer are applied to the surface of a part of a device in liquid state. Preferably, the layers in the context of the present invention, including the light-emitting layer B, may be prepared by means of spin-coating. This method well-known to those skilled in the art allows obtaining thin and (essentially) homogeneous layers.

Alternatively, the layers in the context of the present invention, including the light-emitting layer B, may be prepared by other methods based on liquid processing such as, e.g., casting (e.g., drop-casting) and rolling methods, and printing methods (e.g., inkjet printing, gravure printing, blade coating). This may optionally be carried out in an inert atmosphere (e.g., in a nitrogen atmosphere).

In another preferred embodiment, the layers in the context of the present invention may be prepared by any other method known in the art, including but not limited to vacuum processing methods well-known to those skilled in the art such as, e.g., thermal (co-)evaporation, organic vapor phase deposition (OVPD), and deposition by organic vapor jet printing (OVJP).

When preparing layers by means of liquid processing, the solutions including the components of the layers (i.e., with respect to the light-emitting layer B of the present invention, at least one host compound $H^B$ and, typically, at least one first TADF material $E^B$, at least one second TADF material $S^B$ and optionally one or more other host compounds $H^{B2}$) may further comprise a volatile organic solvent. Such volatile organic solvent may optionally be one selected from the group consisting of tetrahydrofuran, dioxane, chlorobenzene, diethylene glycol diethyl ether, 2-(2-ethoxyethoxy) ethanol, gamma-butyrolactone, N-methyl pyrrolidinon, ethoxyethanol, xylene, toluene, anisole, phenetol, acetonitrile, tetrahydrothiophene, benzonitrile, pyridine, trihydrofuran, triarylamine, cyclohexanone, acetone, propylene carbonate, ethyl acetate, benzene and PGMEA (propylen glycol monoethyl ether acetate). Also a combination of two or more solvents may be used. After applied in liquid state, the layer may subsequently be dried and/or hardened by any means of the art, exemplarily at ambient conditions, at increased temperature (e.g., about 50° C. or about 60° C.) or at diminished pressure.

Optionally, an organic electroluminescent device (e.g., an OLED) may exemplarily be an essentially white organic electroluminescent device or a blue organic electroluminescent device. Exemplarily such white organic electroluminescent device may comprise at least one (deep) blue emitter compound (e.g., TADF material $E^B$) and one or more emitter compounds emitting green and/or red light. Then, there may also optionally be energy transmittance between two or more compounds as described above.

The organic electroluminescent device as a whole may also form a thin layer of a thickness of not more than 5 mm, more than 2 mm, more than 1 mm, more than 0.5 mm, more than 0.25 mm, more than 100 μm, or more than 10 μm.

An organic electroluminescent device (e.g., an OLED) may be a small-sized (e.g., having a surface not larger than 5 mm$^2$, or even not larger than 1 mm$^2$), medium-sized (e.g., having a surface in the range of 0.5 to 20 cm$^2$), or a large-sized (e.g., having a surface larger than 20 cm$^2$). An organic electroluminescent device (e.g., an OLED) according to the present invention may optionally be used for generating screens, as large-area illuminating device, as luminescent wallpaper, luminescent window frame or glass, luminescent label, luminescent poser or flexible screen or display. Next to the common uses, an organic electroluminescent device (e.g., an OLED) may exemplarily also be used as luminescent films, "smart packaging" labels, or innovative design elements. Further they are usable for cell detection and examination (e.g., as bio labelling).

One of the main purposes of an organic electroluminescent device is the generation of light. Thus, the present invention further relates to a method for generating light of a desired wavelength range, comprising the step of providing an organic electroluminescent device according to any the present invention.

Accordingly, a further aspect of the present invention relates to a method for generating light of a desired wavelength range, comprising the steps of
(i) providing an organic electroluminescent device according to the present invention; and
(ii) applying an electrical current to said organic electroluminescent device.

A further aspect of the present invention relates to a process of making the organic electroluminescent devices by assembling the elements described above. The present invention also relates to a method for generating blue, green, yellow, orange, red or white light, in particular blue or white light by using said organic electroluminescent device.

The FIGURE and Examples and claims further illustrate the invention.

BRIEF DESCRIPTION OF THE FIGURE

The FIGURE shows an emission spectrum of device C2 at 7V.

EXAMPLES

Cyclic Voltammetry

Cyclic voltammograms of solutions having concentration of 10-3 mol/l of the organic molecules in dichloromethane or a suitable solvent and a suitable supporting electrolyte (e.g. 0.1 mol/l of tetrabutylammonium hexafluorophosphate) are measured. The measurements are conducted at room temperature and under nitrogen atmosphere with a three-electrode assembly (Working and counter electrodes: Pt wire, reference electrode: Pt wire) and calibrated using $FeCp_2/FeCp_2^+$ as internal standard. HOMO data was corrected using ferrocene as internal standard against SCE.

Density Functional Theory Calculation

Molecular structures are optimized employing the BP86 functional and the resolution of identity approach (RI). Excitation energies are calculated using the (BP86) optimized structures employing Time-Dependent DFT (TD-DFT) methods. Orbital and excited state energies are calculated with the B3LYP functional. Def2-SVP basis sets (and a m4-grid for numerical integration were used. The Turbomole program package was used for all calculations.

Photophysical Measurements

Sample pretreatment: Spin-coating

Apparatus: Spin150, SPS euro.

The sample concentration is 10 mg/ml, dissolved in a suitable solvent. Program: 1) 3 s at 400 U/min, 20 s at 1000 U/min at 1000 Upm/s. 3) 10 s at 4000 U/min at 1000 Upm/s. After coating, the films are tried at 70° C. for 1 min.

Photoluminescence spectroscopy and TCSPC (Time-correlated single-photon counting)

Steady-state emission spectroscopy is recorded using a Horiba Scientific, Modell FluoroMax-4 equipped with a 150 W Xenon-Arc lamp, excitation- and emissions monochromators and a Hamamatsu R928 photomultiplier and a time-correlated single-photon counting option. Emissions and excitation spectra are corrected using standard correction fits.

Excited state lifetimes are determined employing the same system using the TCSPC method with FM-2013 equipment and a Horiba Yvon TCSPC hub.

Excitation Sources:

NanoLED 370 (wavelength: 371 nm, puls duration: 1,1 ns)

NanoLED 290 (wavelength: 294 nm, puls duration: <1 ns)

SpectraLED 310 (wavelength: 314 nm)

SpectraLED 355 (wavelength: 355 nm).

Data analysis (exponential fit) was done using the software suite DataStation and DAS6 analysis software. The fit is specified using the chi-squared-test.

Photoluminescence Quantum Yield Measurements

For photoluminescence quantum yield (PLQY) measurements an Absolute PL Quantum Yield Measurement C9920-O3G system (Hamamatsu Photonics) is used. Quantum yields and CIE coordinates were determined using the software U6039-$C_5$ version 3.6.0.

Emission maxima are given in nm, quantum yields φ in % and CIE coordinates as x,y values.

PLQY was determined using the following protocol:
1) Quality assurance: Anthracene in ethanol (known concentration) is used as reference
2) Excitation wavelength: the absorption maximum of the organic molecule is determined and the molecule is excited using this wavelength
3) Measurement Quantum yields are measured for sample of solutions or films under nitrogen atmosphere. The yield is calculated using the equation:

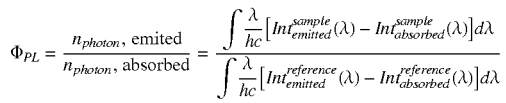

wherein $n_{photon}$ denotes the photon count and Int. is the intensity.

Production and Characterization of Organic Electroluminescence Devices

Via vacuum-deposition methods OLED devices comprising organic molecules according to the invention can be produced. If a layer contains more than one compound, the weight-percentage of one or more compounds is given in %. The total weight-percentage values amount to 100%, thus if a value is not given, the fraction of this compound equals to the difference between the given values and 100%.

The not fully optimized OLEDs are characterized using standard methods and measuring electroluminescence spectra, the external quantum efficiency (in %) in dependency on the intensity, calculated using the light detected by the photodiode, and the current. The OLED device lifetime is extracted from the change of the luminance during operation at constant current density. The LT50 value corresponds to the time, where the measured luminance decreased to 50% of the initial luminance, analogously LT80 corresponds to the time point, at which the measured luminance decreased to 80% of the initial luminance, LT97 to the time point, at which the measured luminance decreased to 97% of the initial luminance etc.

Accelerated lifetime measurements are performed (e.g. applying increased current densities). Exemplarily LT80 values at 500 cd/m² are determined using the following equation:

$$LT80\left(500\ \frac{cd^2}{m^2}\right) = LT80(L_0)\left(\frac{L_0}{500\ \frac{cd^2}{m^2}}\right)^{1.6}$$

wherein $L_0$ denotes the initial luminance at the applied current density.

The values correspond to the average of several pixels (typically two to eight), the standard deviation between these pixels is given. Figures show the data series for one OLED pixel.

Example D1 and Comparative Examples C1 and C2

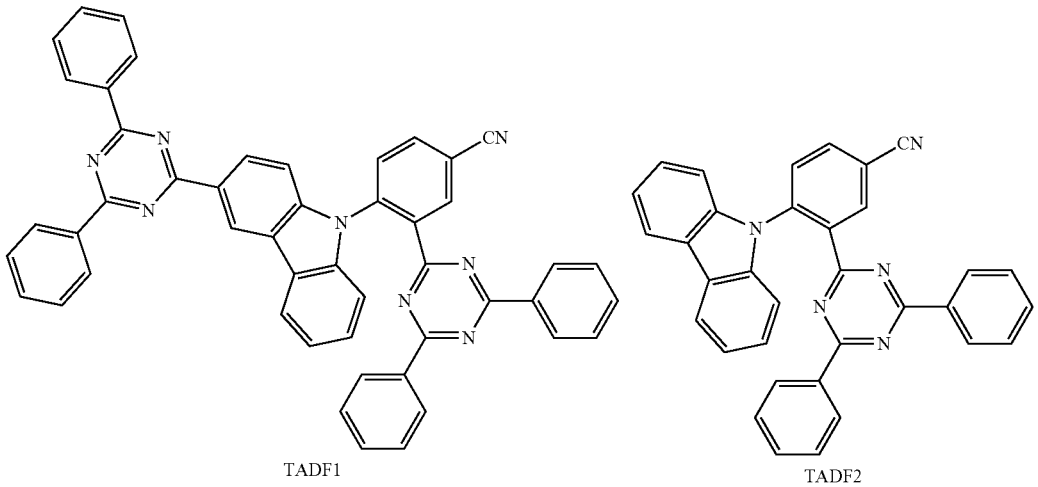

|  | HOMO [eV] | LUMO [eV] | S1 [eV] | T1 [eV] |
|---|---|---|---|---|
| mCBP | −6.02 | −2.34 |  | 2.95 |
| TADF1 | −6.16 | −3.16 | 2.94 | 2.83 |
| TADF2 | −6.07 | −3.17 | 2.87 | 2.80 |

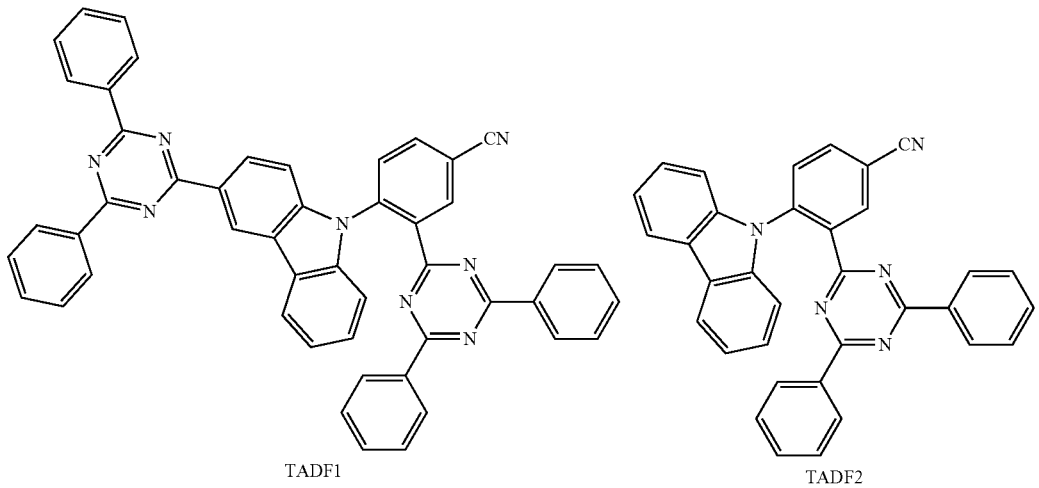

| Layer | Thickness | D1 | C1 | C2 |
|---|---|---|---|---|
| 8 | 100 nm | Al | Al | Al |
| 7 | 2 nm | Liq | Liq | Liq |
| 6 | 25 nm | NBPhen | NBPhen | NBPhen |
| 5 | 50 nm | TADF1 (15%): TADF2 (5%): mCBP (80%) | TADF2 (5%): T2T (15%): mCBP (80%) | TADF1 (20%): mCBP (80%) |
| 4 | 10 nm | mCBP | mCBP | mCBP |
| 3 | 10 nm | TCTA | TCTA | TCTA |
| 2 | 85 nm | NPB | NPB | NPB (95 nm) |
| 1 | 130 nm | ITO | ITO | ITO |
| substrate | | glass | glass | glass |

Device D1 yielded an external quantum efficiency (EQE) at 1000 cd/m² of 12.7±0.2%. The LT97 value at 730 cd/m² was determined to be 18 h from accelerated lifetime measurements. The emission maximum is at 469 nm with a FWHM of 60 nm at 5 V. The corresponding CIEx value is 0.157 and CIEy is 0.227.

Comparative device C1 comprises the same layer arrangement as device D1, except that the emitting layer contains only emitter TADF2 and TADF1 is replaced by T2T. The EQE at 1000 cd/m² is significantly reduced to 8.7±0.1% and the lifetime is shortened (LT97 at 730 cd/m²=11h). The emission maximum is red-shifted at 472 nm with a FWHM of 64 nm at 5 V. The corresponding CIEx value is 0.162 and CIEy is 0.237.

Comparative device C2 comprises an emitting layer containing only TADF1 as emitter. The EQE at 1000 cd/m² is comparable to D1 at 12.3±0.2%, but the lifetime is significantly shortened (LT97 at 730 cd/m²=6 h). The emission maximum appears again red-shifted at 473 nm with a FWHM of 61 nm at 5 V. The corresponding CIEx value is 0.148 and CIEy is 0.207. The lowered CIEy coordinate can be attributed to a shoulder at around 410 nm in the spectrum attributable to the emission of NBPhen (Figure) indicating a less well balanced charge distribution within the EML.

The invention claimed is:

1. An organic electroluminescent device comprising a light-emitting layer B comprising:
(i) a host material $H^B$, which has a lowermost excited singlet state energy level $S1^H$ and a lowermost excited triplet state energy level $T1^H$;
(ii) a first thermally activated delayed fluorescence (TADF) material $E^B$, which has a lowermost excited singlet state energy level $S1^E$ and a lowermost excited triplet state energy level $T1^E$; and
(iii) a second TADF material $S^B$, which has a lowermost excited singlet state energy level $S1^S$ and a lowermost excited triplet state energy level $T1^S$,
wherein $E^B$ transfers energy to $S^B$ and $S^B$ emits thermally activated delayed fluorescence with an emission maximum between 420 and 500 nm; and wherein the relations expressed by the following formulas (1) to (4) apply:

$$S1^H > S1^E \tag{1}$$

$$S1^H > S1^S \tag{2}$$

$$S1^E > S1^S \tag{3}$$

$$T1^H > T1^S \tag{4}$$

2. The organic electroluminescent device according to claim 1, wherein said organic electroluminescent device is a device selected from the group consisting of an organic light emitting diode, a light emitting electrochemical cell, and a light-emitting transistor.

3. The organic electroluminescent device according to claim 1, wherein the first TADF material $E^B$ is an organic TADF emitter.

4. The organic electroluminescent device according to claim 1, wherein the second TADF material $S^B$ is an organic TADF emitter.

5. The organic electroluminescent device according to claim 1, wherein the device exhibits an emission maximum $\lambda_{max}(D)$ of 440 to 470 nm.

6. The organic electroluminescent device according to claim 1, wherein the light-emitting layer B comprises:
   (i) 5-98% by weight of the host compound $H^B$;
   (ii) 1-50% by weight of the first TADF material $E^B$; and
   (iii) 1-50% by weight of the second TADF material $S^B$; and optionally
   (iv) 0-93% by weight of one or more further host compounds $H^{B2}$ differing from $H^B$; and optionally
   (v) 0-93% by weight of one or more solvents.

7. The organic electroluminescent device according to claim 1, wherein the second TADF material $S^B$ exhibits an emission maximum $\lambda_{max}^{PMMA}(S^B)$ and the first TADF material $E^B$ exhibits an emission maximum $\lambda_{max}^{PMMA}(E^B)$, wherein $$500\ nm \geq \lambda_{max}^{PMMA}(S^B) > \lambda_{max}^{PMMA}(E^B).$$

8. The organic electroluminescent device according to claim 1, wherein the first TADF material $E^B$ exhibits an emission maximum $\lambda_{max}^{PMMA}(E^B)$ in the range of from 450 to 470 nm.

9. The organic electroluminescent device according to claim 1, wherein the second TADF material $S^B$ exhibits an emission maximum $\lambda_{max}^{PMMA}(S^B)$, the first TADF material $E^B$ exhibits an emission maximum $\lambda_{max}^{PMMA}(E^B)$ and the device exhibits an emission maximum $\lambda_{max}(D)$, wherein $$\lambda_{max}^{PMMA}(S^B) > \lambda_{max}(D) \geq \lambda_{max}^{PMMA}(E^B).$$

10. The organic electroluminescent device according to claim 1, wherein $T1^E > T1^S$.

11. The organic electroluminescent device according to claim 1, wherein $$S1^E > S1^S \geq T1^E > T1^S \text{ and}$$

$$S1^E - T1^S \leq 0.4\ eV.$$

12. The organic electroluminescent device according to claim 1, wherein first TADF material $E^B$ and the second TADF material $S^B$ are independently from another both chosen from molecules of a structure of Formula I

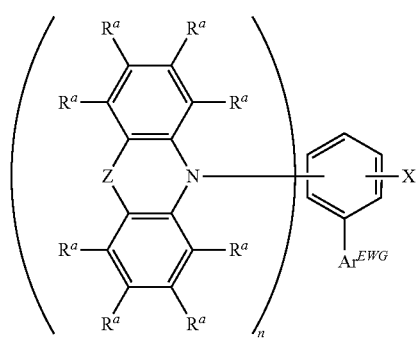

Formula I wherein
  n is at each occurrence independently from another 1 or 2;
  X is at each occurrence independently from another CN or $CF_3$;
  Z is at each occurrence independently from another selected from the group consisting of a direct bond, $CR^3R^4$, $C=CR^3R^4$, $C=O$, $C=NR^3$, $NR^3$, $O$, $SiR^3R^4$, $S$, $S(O)$, and $S(O)_2$;

$Ar^{EwG}$ is at each occurrence independently from another a structure according to one of Formulas IIa to IIi

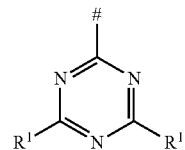

Formula IIa

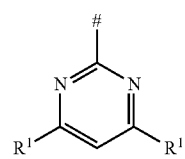

Formula IIb

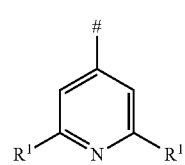

Formula IIc

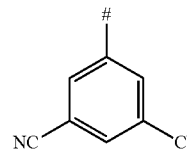

Formula IId

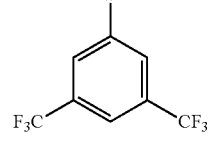

Formula IIe

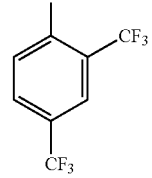

Formula IIf

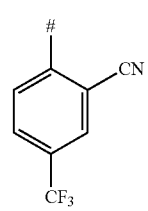

Formula IIg

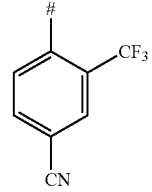

Formula IIh

-continued

Formula IIi

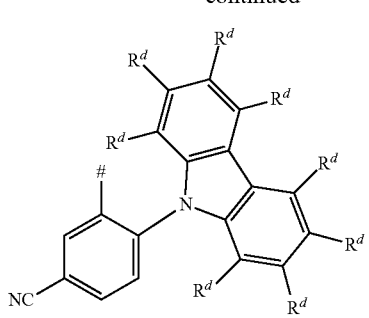

wherein # represents the binding site of the single bond linking $Ar^{EWG}$ to the substituted central phenyl ring of Formula I;

$R^1$ is at each occurrence independently from another selected from the group consisting of hydrogen, deuterium, $C_1$-$C_5$-alkyl, wherein one or more hydrogen atoms are optionally substituted by deuterium, and $C_6$-$C_{18}$-aryl, which is optionally substituted with one or more substituents $R^6$;

$R^2$ is at each occurrence independently from another selected from the group consisting of hydrogen, deuterium, $C_1$-$C_5$-alkyl, wherein one or more hydrogen atoms are optionally substituted by deuterium, and $C_6$-$C_{18}$-aryl, which is optionally substituted with one or more substituents $R^6$;

$R^a$, $R^3$, and $R^4$ is at each occurrence independently from another selected from the group consisting of hydrogen, deuterium, $N(R^5)_2$, $OR^5$, $SR^5$, $Si(R^5)_3$, $CF_3$, CN, F, $C_1$-$C_{40}$-alkyl, which is optionally substituted with one or more substituents $R^5$ and wherein one or more non-adjacent $CH_2$-groups are optionally substituted by $R^5C=CR^5$, $C\equiv C$, $Si(R^5)_2$, $Ge(R^5)_2$, $Sn(R^5)_2$, C=O, C=S, C=Se, C=NR$^5$, P(=O)(R$^5$), SO, SO$_2$, NR$^5$, O, S, or CONR$^5$;

$C_1$-$C_{40}$-thioalkoxy, which is optionally substituted with one or more substituents $R^5$ and wherein one or more non-adjacent $CH_2$-groups are optionally substituted by $R^5C=CR^5$, $C\equiv C$, $Si(R^5)_2$, $Ge(R^5)_2$, $Sn(R^5)_2$, C=O, C=S, C=Se, C=NR$^5$, P(=O)(R$^5$), SO, SO$_2$, NR$^5$, O, S, or CONR$^5$;

$C_6$-$C_{60}$-aryl, which is optionally substituted with one or more substituents $R^5$; and $C_3$-$C_{57}$-heteroaryl, which is optionally substituted with one or more substituents $R^5$;

$R^5$ is at each occurrence independently from another selected from the group consisting of hydrogen, deuterium, $N(R^6)_2$, $OR^6$, $SR^6$, $Si(R^6)_3$, $CF_3$, CN, F, $C_1$-$C_{40}$-alkyl, which is optionally substituted with one or more substituents $R^6$ and wherein one or more non-adjacent $CH_2$-groups are optionally substituted by $R^6C=CR^6$, $C\equiv C$, $Si(R^6)_2$, $Ge(R^6)_2$, $Sn(R^6)_2$, C=O, C=S, C=Se, C=NR$^6$, P(=O)(R$^6$), SO, SO$_2$, NR$^6$, O, S, or CONR$^6$;

$C_6$-$C_{60}$-aryl, which is optionally substituted with one or more substituents $R^6$; and $C_3$-$C_{57}$-heteroaryl, which is optionally substituted with one or more substituents $R^6$;

$R^6$ is at each occurrence independently from another selected from the group consisting of hydrogen, deuterium, OPh, $CF_3$, CN, F, $C_1$-$C_5$-alkyl, wherein one or more hydrogen atoms are optionally, independently from each other, substituted by deuterium, CN, $CF_3$, or F;

$C_1$-$C_5$-alkoxy, wherein one or more hydrogen atoms are optionally, independently from each other, substituted by deuterium, CN, $CF_3$, or F;

$C_1$-$C_5$-thioalkoxy, wherein one or more hydrogen atoms are optionally, independently from each other, substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-aryl$)_2$;

$N(C_3$-$C_{17}$-heteroaryl$)_2$; and $N(C_3$-$C_{17}$-heteroaryl$)(C_6$-$C_{18}$-aryl$)$;

$R^d$ is at each occurrence independently from another selected from the group consisting of hydrogen, deuterium, $N(R^5)_2$, $OR^5$, $SR^5$, $Si(R^5)_3$, $CF_3$, CN, F, $C_1$-$C_{40}$-alkyl, which is optionally substituted with one or more substituents $R^5$ and wherein one or more non-adjacent $CH_2$-groups are optionally substituted by $R^5C=CR^5$, $C\equiv C$, $Si(R^5)_2$, $Ge(R^5)_2$, $Sn(R^5)_2$, C=O, C=S, C=Se, C=NR$^5$, P(=O)(R$^5$), SO, SO$_2$, NR$^5$, O, S, or CONR$^5$;

$C_1$-$C_{40}$-thioalkoxy, which is optionally substituted with one or more substituents $R^5$ and wherein one or more non-adjacent $CH_2$-groups are optionally substituted by $R^5C=CR^5$, $C\equiv C$, $Si(R^5)_2$, $Ge(R^5)_2$, $Sn(R^5)_2$, C=O, C=S, C=Se, C=NR$^5$, P(=O)(R$^5$), SO, SO$_2$, NR$^5$, O, S, or CONR$^5$; and $C_6$-$C_{60}$-aryl, which is optionally substituted with one or more substituents $R^5$; and $C_3$-$C_{57}$-heteroaryl which is optionally substituted with one or more substituents $R^5$;

wherein the substituents $R^a$, $R^3$, $R^4$, or $R^5$ independently from each other optionally may form a mono- or polycyclic, aliphatic, aromatic, and/or benzo-fused ring system with one or more substituents $R^a$, $R^3$, $R^4$, or $R^5$, and wherein the one or more substituents $R^d$ independently from each other optionally may form a mono- or polycyclic, aliphatic, aromatic, and/or benzo-fused ring system with one or more substituents $R^d$.

13. The organic electroluminescent device according to claim 12, wherein the first TADF material $E^B$ and the second TADF material $S^B$ both bear the same structure according to Formula I structurally only differing in one or more of $R^a$, $R^1$, $R^2$, and X.

14. The organic electroluminescent device according to claim 12, wherein Z is a direct bond at each occurrence.

15. The organic electroluminescent device according to claim 12, wherein $R^a$ is at each occurrence independently from another selected from the group consisting of hydrogen, deuterium, Me, $^i$Pr, $^t$Bu, CN, $CF_3$, Ph, which is optionally substituted with one or more substituents independently from each other selected from the group consisting of Me, $^i$Pr, $^t$Bu, CN, $CF_3$, and Ph;

pyridinyl, which is optionally substituted with one or more substituents independently from each other selected from the group consisting of Me, $^i$Pr, $^t$Bu, CN, $CF_3$, and Ph;

pyrimidinyl, which is optionally substituted with one or more substituents independently from each other selected from the group consisting of Me, $^i$Pr, $^t$Bu, CN, $CF_3$, and Ph;

carbazolyl, which is optionally substituted with one or more substituents independently from each other selected from the group consisting of Me, $^i$Pr, $^t$Bu, CN, $CF_3$, and Ph;

triazinyl, which is optionally substituted with one or more substituents independently from each other selected from the group consisting of Me, $^i$Pr, $^t$Bu, CN, $CF_3$, and Ph; and $N(Ph)_2$.

16. The organic electroluminescent device according to claim 1, wherein the second TADF material $S^B$ exhibits an emission maximum $\lambda_{max}^{PMMA}(S^B)$ and the first TADF material $E^B$ exhibits an emission maximum $\lambda_{max}^{PMMA}(E^B)$, wherein $$480 \text{ nm } \lambda_{max}^{PMMA}(S^B) > \lambda_{max}^{PMMA}(E^B).$$

* * * * *